(12) United States Patent
Ahn et al.

(10) Patent No.: US 11,574,883 B2
(45) Date of Patent: Feb. 7, 2023

(54) SEMICONDUCTOR MEMORY DEVICE, ELECTRONIC SYSTEM INCLUDING THE SAME, AND METHOD FOR FABRICATING THE SAME

(71) Applicant: SAMSUNG ELECTRONICS CO., LTD., Suwon-si (KR)

(72) Inventors: Jae Ho Ahn, Seoul (KR); Ji Won Kim, Seoul (KR); Sung-Min Hwang, Hwaseong-si (KR); Joon-Sung Lim, Seongnam-si (KR); Suk Kang Sung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 5 days.

(21) Appl. No.: 17/389,841

(22) Filed: Jul. 30, 2021

(65) Prior Publication Data
US 2022/0130782 A1    Apr. 28, 2022

(30) Foreign Application Priority Data

Oct. 22, 2020    (KR) .................. 10-2020-0137563

(51) Int. Cl.
*H01L 25/065*    (2006.01)
*H01L 23/535*    (2006.01)
(Continued)

(52) U.S. Cl.
CPC ........ *H01L 24/08* (2013.01); *H01L 21/76805* (2013.01); *H01L 21/76895* (2013.01);
(Continued)

(58) Field of Classification Search
CPC ... H01L 25/0657; H01L 24/08; H01L 23/535; H01L 25/18; H01L 2224/08145;
(Continued)

(56) References Cited

U.S. PATENT DOCUMENTS 10,510,738 B2    12/2019    Kim et al.
2019/0296041 A1    9/2019    Yamasaka et al.
(Continued)

FOREIGN PATENT DOCUMENTS

CN    107658315 A    2/2018
CN    110494979 A    11/2019
(Continued)

*Primary Examiner* — Thanh Y. Tran
(74) *Attorney, Agent, or Firm* — Lee IP Law, P.C.

(57) ABSTRACT

A semiconductor memory device includes a first substrate including opposite first and second surfaces, a mold structure including gate electrodes stacked on the first surface of the first substrate, a channel structure through the mold structure, a first contact via penetrating the first substrate, a second substrate including opposite third and fourth surfaces, a circuit element on the third surface of the second substrate, a first through-via through the mold structure connecting the first contact via and the circuit element, the first through-via including a first conductive pattern, and a first spacer separating the first conductive pattern from the mold structure, and a second through-via through the mold structure and spaced apart from the first through-via, the second through-via including a second conductive pattern, and a second spacer separating the second conductive pattern from the first substrate and the mold structure.

20 Claims, 26 Drawing Sheets

(51) Int. Cl.
*H01L 23/00* (2006.01)
*H01L 25/18* (2006.01)
*H01L 21/768* (2006.01)
*H01L 25/00* (2006.01)

(52) U.S. Cl.
CPC ............ *H01L 23/535* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ... H01L 2924/1431; H01L 2924/14511; H01L 21/76805; H01L 21/76895; H01L 25/50; H01L 2224/80895; H01L 2224/80896; H01L 27/11556; H01L 27/11582; H01L 2225/06506; H01L 2225/0651; H01L 2225/06541; H01L 2225/06548; H01L 27/1157; H01L 27/11573; H01L 21/76898; H01L 24/05
See application file for complete search history.

(56) References Cited

U.S. PATENT DOCUMENTS

| | | | | |
|---|---|---|---|---|
| 2020/0286990 | A1* | 9/2020 | Uchiyama | H01L 21/76275 |
| 2022/0068858 | A1* | 3/2022 | Horiuchi | H01L 25/50 |
| 2022/0084970 | A1* | 3/2022 | Tomimatsu | H01L 27/11573 |
| 2022/0102306 | A1* | 3/2022 | Ahn | H01L 24/08 |
| 2022/0270992 | A1* | 8/2022 | Wada | H01L 25/18 |

FOREIGN PATENT DOCUMENTS

| | | |
|---|---|---|
| CN | 110637368 A | 12/2019 |
| CN | 110692138 A | 1/2020 |
| CN | 111211133 A | 5/2020 |
| CN | 111279480 A | 6/2020 |

* cited by examiner

SEMICONDUCTOR MEMORY DEVICE, ELECTRONIC SYSTEM INCLUDING THE SAME, AND METHOD FOR FABRICATING THE SAME

CROSS-REFERENCE TO RELATED APPLICATION

Korean Patent Application No. 10-2020-0137563 filed on Oct. 22, 2020, in the Korean Intellectual Property Office, and entitled: "Semiconductor Memory Device, Electronic System Including the Same, and Method for Fabricating the Same," is incorporated by reference herein in its entirety.

BACKGROUND

1. Field

The present disclosure relates to a semiconductor memory device, an electronic system including the same, and a method for fabricating the same. More specifically, the present disclosure relates to a semiconductor memory device including a through-via, an electronic system including the same, and a method for fabricating the same.

2. Description of the Related Art

In order to satisfy excellent performance and low price required by consumers, it is required to increase a degree of integration of a semiconductor memory device. In the case of the semiconductor memory device, because the degree of integration is an important factor in determining the price of products, an increased density is particularly required.

For example, in the case of a two-dimensional (2D) or planar semiconductor memory device, the degree of integration is mainly determined by an area occupied by a unit memory cell, and is therefore greatly affected by the level of fine pattern forming technology. However, since ultra-expensive apparatuses are required for miniaturization of the pattern, the degree of integration of 2D semiconductor memory devices may be insufficient. As a result, three-dimensional (3D) semiconductor memory devices equipped with memory cells arranged three-dimensionally have been proposed.

SUMMARY

According to an aspect of the present disclosure, there is provided a semiconductor memory device including a first substrate with a first surface and a second surface opposite to each other, a mold structure including a plurality of gate electrodes stacked sequentially on the first surface of the first substrate, a channel structure which penetrates the mold structure and intersects the plurality of gate electrodes, a first contact via penetrating the first substrate, a second substrate including a third surface facing the first surface, and a fourth surface opposite to the third surface, a circuit element on the third surface of the second substrate, a first through-via which penetrates the mold structure and connects the first contact via and the circuit element, and a second through-via which is spaced apart from the first through-via and penetrates the mold structure, wherein the first through-via includes a first conductive pattern, and a first spacer film which separates the first conductive pattern from the mold structure, and the second through-via includes a second conductive pattern, and a second spacer film which separates the second conductive pattern from the first substrate and the mold structure.

According to another aspect of the present disclosure, there is provided a semiconductor memory device including a first substrate w a first surface and a second surface opposite to each other, a mold structure including a plurality of gate electrodes stacked sequentially, on the first surface of the first substrate, a channel structure which penetrates the mold structure and intersects the plurality of gate electrodes, a first through-via which includes a first conductive pattern which penetrates the mold structure, and a first spacer film which separates the first conductive pattern from the mold structure, a second through-via which includes a second conductive pattern which penetrates the mold structure, and a second spacer film which separates the second conductive pattern from the first substrate and the mold structure, an upper insulating film on the second surface of the first substrate, a contact via trench which penetrates the upper insulating film and the first substrate and exposes the first conductive pattern, a contact via which includes a third spacer film extending along side surfaces of the contact via trench, and a third conductive pattern connected to the first conductive pattern on the third spacer film, an input-output pad connected to the contact via, on the upper insulating film, a second substrate which includes a third surface facing the first surface, and a fourth surface opposite to the third surface, and a first circuit element connected to the first through-via, on the third surface of the second substrate.

According to yet another aspect of the present disclosure, there is provided an electronic system including a main board, a semiconductor memory device on the main board, and a controller which is electrically connected to the semiconductor memory device, on the main board, wherein the semiconductor memory device includes a first substrate including a first surface and a second surface opposite to each other, a mold structure including a plurality of gate electrodes stacked sequentially on the first surface of the first substrate, a channel structure which penetrates the mold structure and intersects the plurality of gate electrodes, a contact via which penetrates the first substrate and is electrically connected to the controller, a second substrate which includes a third surface facing the first surface, and a fourth surface opposite to the third surface, a circuit element on the third surface of the second substrate, a first through-via which penetrates the mold structure and connects the first contact via and the circuit element, and a second through-via which is spaced apart from the first through-via and penetrates the mold structure, wherein the first through-via includes a first conductive pattern, and a first spacer film which separates the first conductive pattern from the mold structure, and the second through-via includes a second conductive pattern, and a second spacer film which separates the second conductive pattern from the first substrate and the mold structure.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor memory device according to an exemplary embodiment will be described referring to FIGS. 1 to 11.

Figure 1:
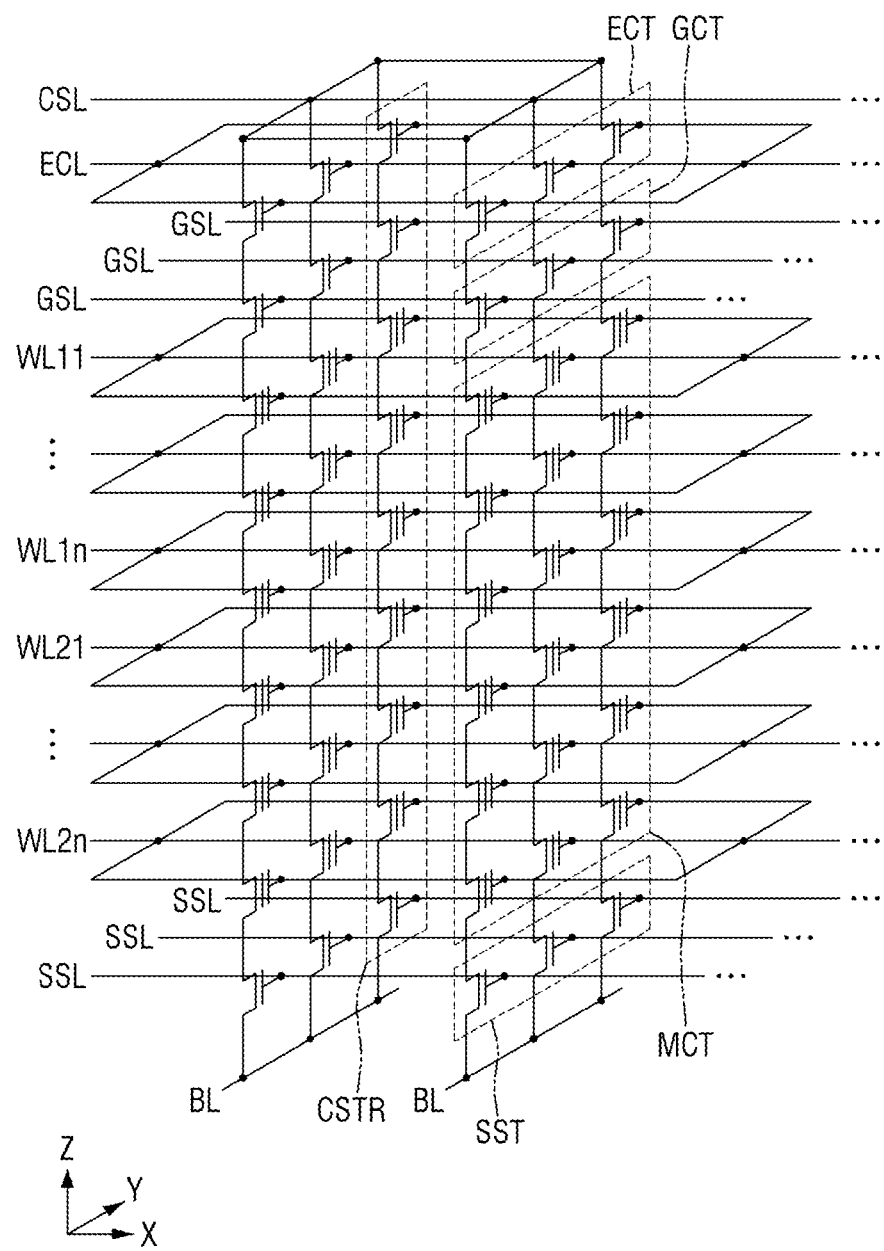
FIG. 1 is an exemplary circuit diagram of a semiconductor memory device according to some embodiments.

FIG. 1 is an exemplary circuit diagram for explaining a semiconductor memory device according to some embodiments.

A memory cell array of a semiconductor memory device according to some embodiments may include a common source line CSL, a plurality of bit lines BL, and a plurality of cell strings CSTR.

The common source line CSL may extend in a first direction X. In some embodiments, a plurality of common source lines CSL may be arranged two-dimensionally. For example, the plurality of common source lines CSL may be spaced apart from each other, and each may extend in the first direction X. A same voltage may be applied to the common source lines CSL, or different voltages may be applied thereto and the common source line CSL may be controlled separately.

The plurality of bit lines BL may be arranged two-dimensionally. For example, the bit lines BL may be spaced apart from each other, and each may extend in a second direction Y that intersects the first direction X. A plurality of cell strings CSTR may be connected in parallel to each bit line BL. The cell strings CSTR may be connected in common to the common source line CSL. That is, the plurality of cell strings CSTR may be placed between the bit lines BL and the common source line CSL.

Each cell string CSTR may include a ground selection transistor GCT connected to the common source line CSL, a string selection transistor SST connected to the bit line BL, and a plurality of memory cell transistors MCT placed between the ground selection transistor GCT and the string selection transistor SST. Each memory cell transistor MCT may include a data storage element. The ground selection transistors GCT, the string selection transistors SST and the memory cell transistors MCT may be connected in series.

The common source line CSL may be commonly connected to sources of the ground selection transistors GCT. Also, the ground selection line GSL, a plurality of word lines WL11 to WL1n, WL21 to WL2n, and the string selection line SSL may be placed between the common source line CSL and the bit line BL. The ground selection line GSL may be used as a gate electrode of the ground selection transistor GCT, the word lines WL11 to WL1n, WL21 to WL2n may be used as gate electrodes of the memory cell transistors MCT, and the string selection line SSL may be used as a gate electrode of the string selection transistor SST.

In some embodiments, an erasure control transistor ECT may be placed between the common source line CSL and the ground selection transistor GST. The common source line CSL may be commonly connected to the sources of the erasure control transistors ECT. Further, an erasure control line ECL may be placed between the common source line CSL and the ground selection line GSL. The erasure control line ECL may be used as a gate electrode of the erasure control transistor ECT. The erasure control transistors ECT may generate a gate induced drain leakage (GIDL) to execute an erasure operation of the memory cell array.

Figure 2:
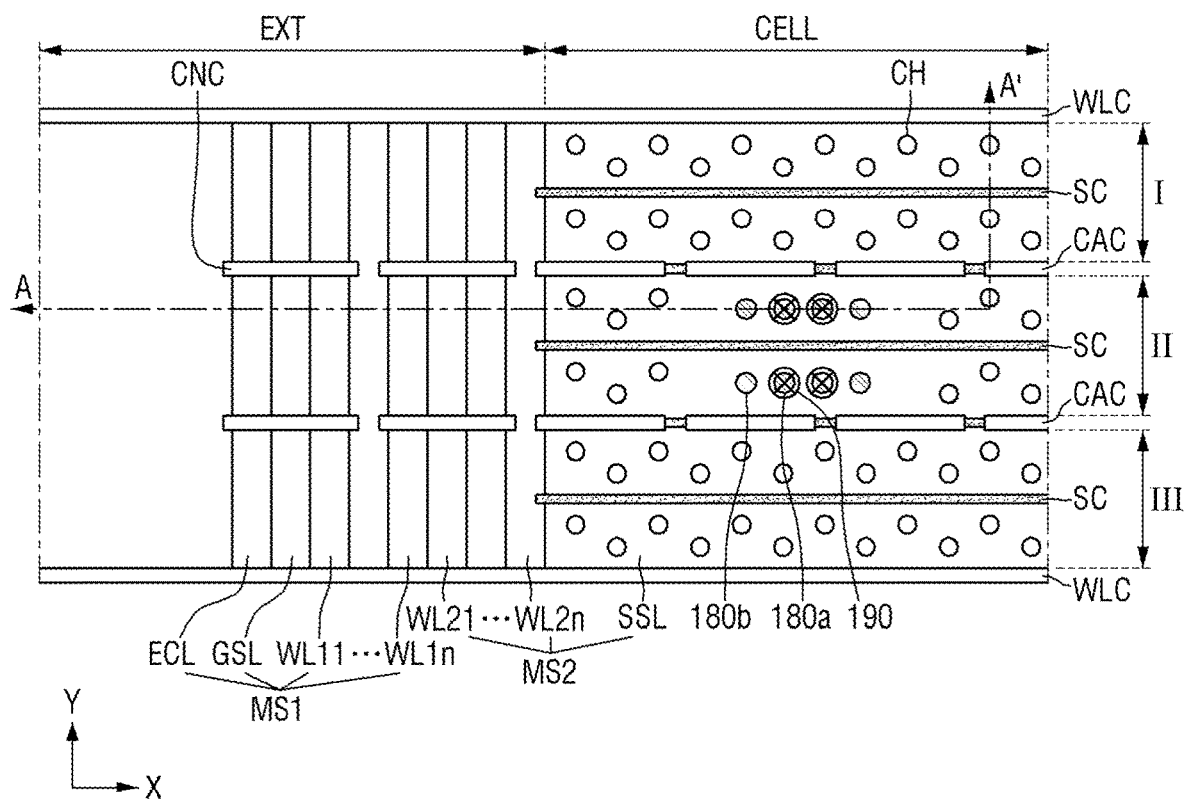
FIG. 2 is a schematic layout diagram of a semiconductor memory device according to some embodiments.
Figure 3:
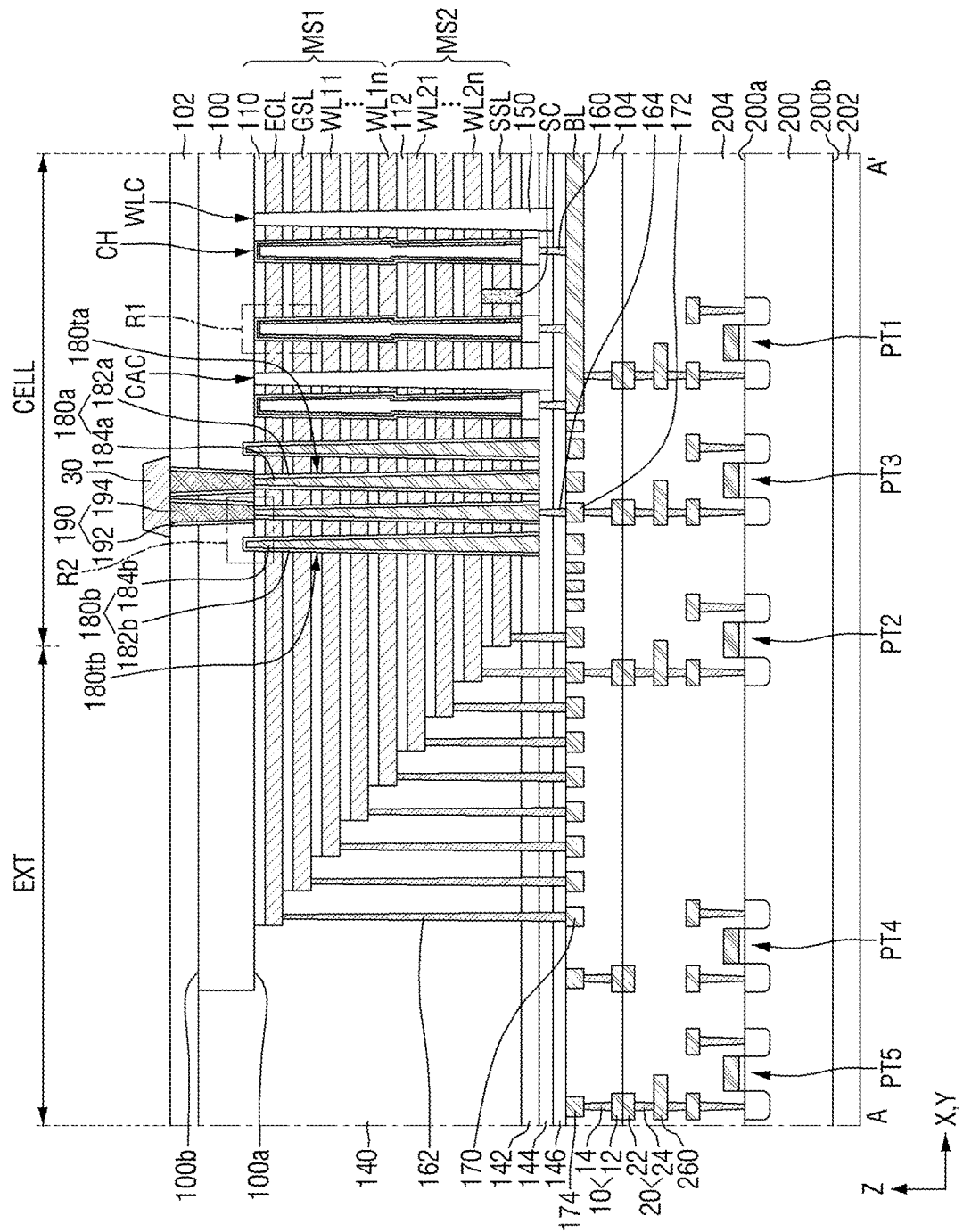
FIG. 3 is a cross-sectional view taken along line A-A' of FIG. 2.
Figure 4A:
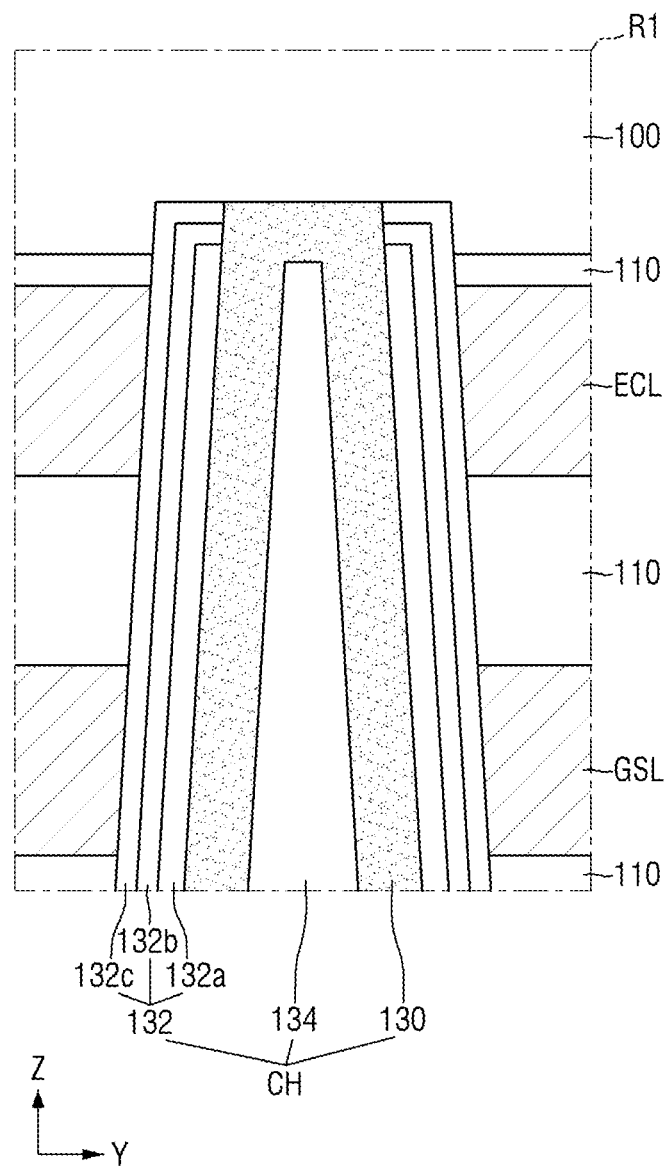
FIGS. 4a and 4b are various views of region R1 of FIG. 3.
Figure 4B:
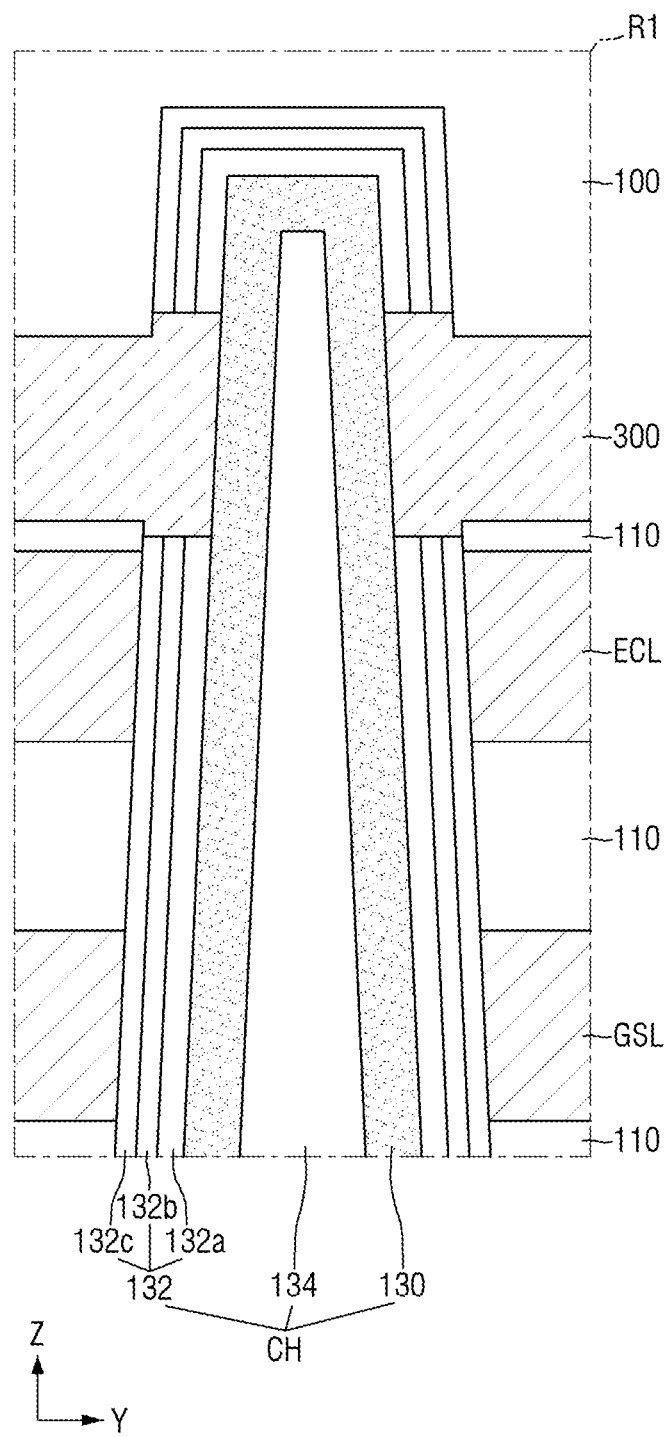
Figure 5A:
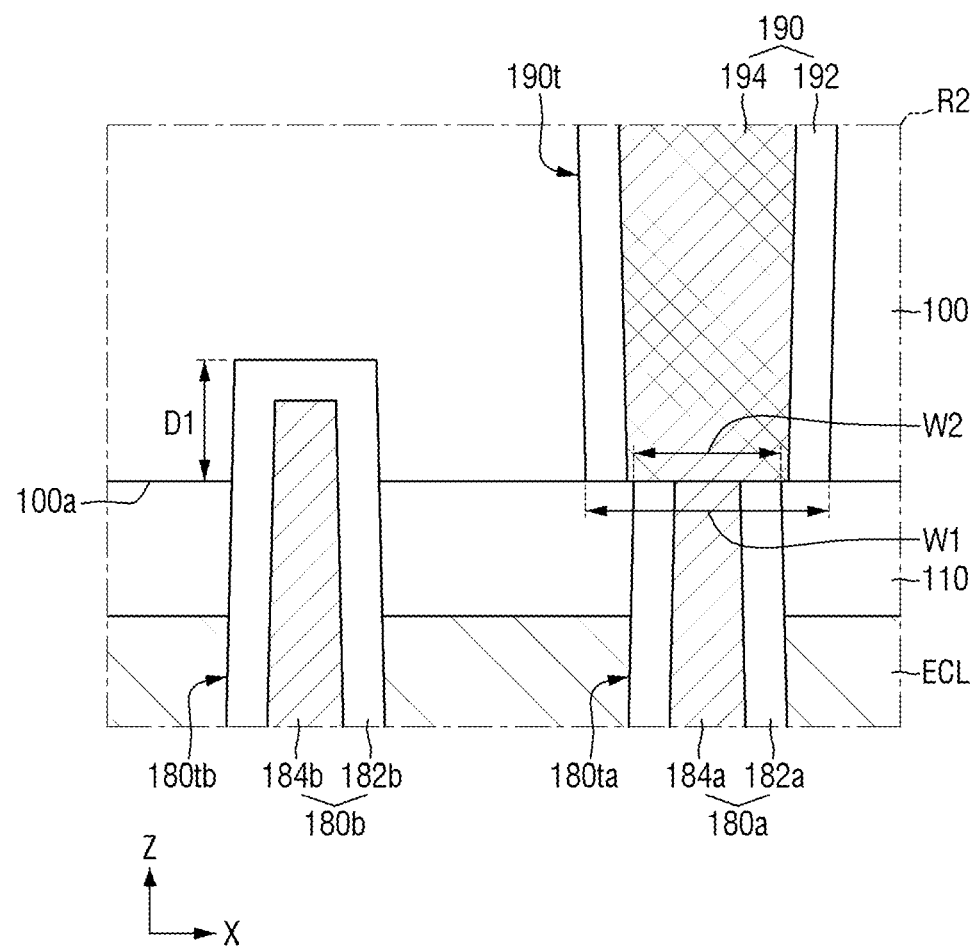
FIGS. 5a and 5b are various enlarged views of region R2 of FIG. 3.
Figure 5B:
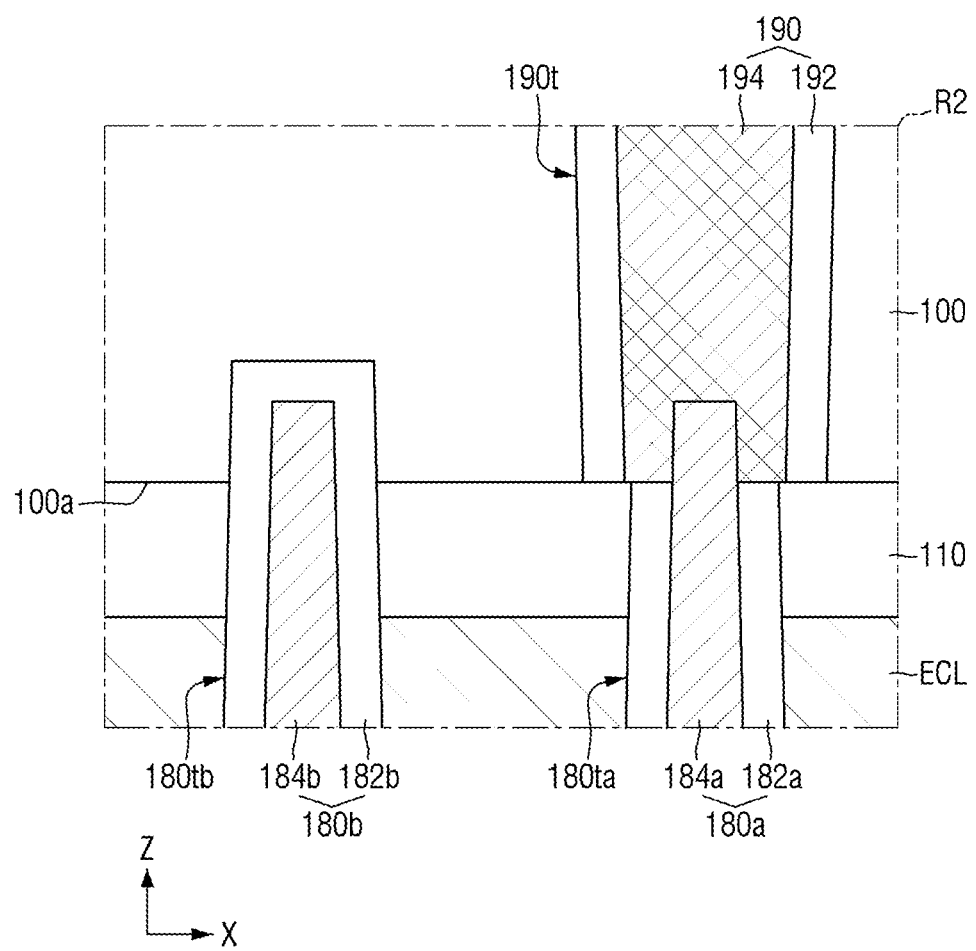

FIG. 2 is a schematic layout diagram for explaining the semiconductor memory device according to some embodiments. FIG. 3 is a cross-sectional view taken along line A-A' of FIG. 2. FIGS. 4a and 4b are various views for explaining region R1 of FIG. 3, and FIGS. 5a and 5b are various enlarged views for explaining region R2 of FIG. 3.

Referring to FIGS. 2 to 5b, a semiconductor memory device according to some embodiments may include a first substrate 100, first and second mold structures MS1 and MS2, interlayer insulating films 140, 142, 144 and 146, a plurality of channel structures CH, the bit lines BL, a block separation region WLC, through-vias 180a and 180b, a first contact via 190, a first input-output pad 30, a first wiring structure 10, a second substrate 200, a plurality of circuit elements PT1 to PT5, and a second wiring structure 20.

The first substrate 100 may include, e.g., a semiconductor substrate such as a silicon substrate, a germanium substrate, or a silicon-germanium substrate. Alternatively, the first substrate 100 may include, e.g., a silicon-on-insulator (SOI) substrate, a germanium-on-insulator (GOI) substrate, or the like.

The first substrate 100 may include a first surface 100a and a second surface 100b opposite to each other. The first substrate 100 may also include a cell array region CAR and an extension region EXT.

A memory cell array including a plurality of memory cells may be formed in the cell array region CAR. The memory cell array may be formed with a plurality of memory cells, a plurality of channel structures CH electrically connected to each of the memory cells, the plurality of word lines WL11 to WL1n, WL21 to WL2n, the plurality of bit lines BL, and the like. The extension region EXT may be placed around the cell array region CAR. A plurality of gate electrodes ECL, GSL, WL11 to WL1n, WL21 to WL2n, and SSL to be described later may be stacked in the extension region EXT in a stepwise manner.

The first and second mold structures MS1 and MS2 may be formed on the first surface 100a of the first substrate 100. The first and second mold structures MS1 and MS2 may include the plurality of gate electrodes ECL, GSL, WL11 to WL1n, WL21 to WL2n, and SSL which are sequentially stacked on the first surface 100a of the first substrate 100. In some embodiments, the first and second mold structures MS1 and MS2 may be sequentially stacked on the first surface 100a of the first substrate 100.

The first mold structure MS1 may be formed on the first substrate 100. The first mold structure MS1 may include a plurality of first mold insulating films 110 and a plurality of first gate electrodes ECL, GSL, and WL11 to WL1n which are alternately stacked on the first substrate 100. For example, each of the first gate electrodes ECL, GSL, and WL11 to WL1n, and each first mold insulating film 110 may have a layered structure extending in the first direction X and the second direction Y parallel to the upper surface (for example, the first surface 100a) of the first substrate 100. Further, the first gate electrodes ECL, GSL, and WL11 to WL1n, and the first mold insulating film 110 may be stacked alternately along a third direction Z that intersects (e.g., perpendicular to) the upper surface of the first substrate 100.

For example, the first gate electrodes ECL, GSL, and WL11 to WL1n may include the erasure control line ECL, the ground selection line GSL, and the plurality of first word lines WL11 to WL1n that are stacked sequentially on the first substrate 100. In another example, the erasure control line ECL may be omitted in some embodiments.

The second mold structure MS2 may be formed on the first mold structure MS1. The second mold structure MS2 may include a plurality of second mold insulating films 112 and a plurality of second gate electrodes WL21 to WL2n, and SSL that are alternately stacked on the first mold structure MS1. For example, each of the second gate electrodes WL21 to WL2n, and SSL and each second mold insulating film 112 may have a layered structure extending in the first direction X and the second direction Y. Further, the second gate electrodes WL21 to WL2n, and SSL and the second mold insulating film 112 may be alternately stacked along the third direction Z. In some embodiments, the plurality of second gate electrodes WL21 to WL2n, and SSL may include a plurality of second word lines WL21 to WL2n and the string selection line SSL that are stacked sequentially on the first mold structure MS1.

The first gate electrodes ECL, GSL, and WL11 to WL1n and the second gate electrodes WL21 to WL2n, and SSL may each include a conductive material. For example, the first gate electrodes ECL, GSL, and WL11 to WL1n and the second gate electrode WL21 to WL2n, and SSL may each include metal, e.g., tungsten (W), cobalt (Co), nickel (Ni) or a semiconductor material, e.g., silicon. The first mold insulating film 110 and the second mold insulating film 112 may each include, e.g., silicon oxides.

The first interlayer insulating film 140 may be formed on the first substrate 100. The first interlayer insulating film 140 may cover the first and second mold structures MS1 and MS2.

Each of the plurality of channel structures CH may penetrate the first and second mold structures MS1 and MS2. Also, the channel structures CH may intersect the plurality of gate electrodes ECL, GSL, WL11 to WL1n, WL21 to WL2n, and SSL. For example, the channel structure CH may be in the shape of a pillar (e.g., a cylindrical shape) extending in the third direction Z.

Although the channel structure CH is shown as being formed only inside the first and second mold structures MS1 and MS2 of the cell array region CELL, this is only for convenience of explanation. For example, in order to reduce the stress applied to the first and second mold structures MS1 and MS2, a dummy channel having a shape similar to the channel structure CH may be formed in the first and second mold structures MS1 and MS2 of the extension region EXT.

As shown in FIGS. 4a and 4b, the channel structure CH may include a semiconductor pattern 130 and an information storage film 132.

Referring to FIGS. 3 and 4a, The semiconductor pattern 130 may extend in the third direction Z and penetrate the mold structures MS1, MS2. Although the semiconductor pattern 130 is shown as a cup shape, this is only an example. For example, the semiconductor pattern 130 may have various shapes, e.g., a cylindrical shape, a square barrel shape, and a solid pillar shape. The semiconductor pattern 130 may include, e.g., semiconductor materials such as single crystal silicon, polycrystalline silicon, organic semiconductor matter and carbon nanostructures.

The information storage film 132 may be interposed between the semiconductor pattern 130 and the respective gate electrodes ECL, GSL, WL11 to WL1n, WL21 to WL2n, and SSL. For example, the information storage film 132 may extend along the side surfaces of the semiconductor pattern 130.

The information storage film 132 may include, e.g., at least one of silicon oxide, silicon nitride, silicon oxynitride, and high dielectric constant materials having a higher dielectric constant than silicon oxide. The high dielectric constant materials may include, e.g., at least one of aluminum oxide, hafnium oxide, lanthanum oxide, tantalum oxide, titanium oxide, lanthanum hafnium oxide, lanthanum aluminum oxide, dysprosium scandium oxide, and combinations thereof.

In some embodiments, the information storage film 132 may be formed of multi-films. For example, the information storage film 132 may include a tunnel insulating film 132a, a charge storage film 132b, and a blocking insulating film 132c which are sequentially stacked on the semiconductor pattern 130.

The tunnel insulating film 132a may include, e.g., a silicon oxide or a high dielectric constant material having a higher dielectric constant than the silicon oxide (e.g., aluminum oxide ($Al_2O_3$), hafnium oxide ($HfO_2$), etc.). The charge storage film 132b may include, e.g., silicon nitride. The blocking insulating film 132c may include, e.g., a silicon oxide or a high dielectric constant material having a higher dielectric constant than the silicon oxide (e.g., aluminum oxide ($Al_2O_3$), hafnium oxide ($HfO_2$), etc.).

In some embodiments, the channel structure CH may further include a filling pattern 134. The filling pattern 134 may be formed to fill the inside of the cup-shaped semiconductor pattern 130. The filling pattern 134 may include insulating materials, e.g., silicon oxides.

In some embodiments, the plurality of channel structures CH may be arranged in a zigzag form. For example, as shown in FIG. 2, a plurality of channel structures CH may be placed alternately with each other in the first direction X and the second direction Y. The plurality of channel structures CH placed in the zigzag form may further improve the degree of integration of the semiconductor memory device.

As shown in FIG. 4b, the semiconductor memory device according to some embodiments may further include a source structure 300. The source structure 300 may be formed on the first substrate 100. The source structure 300 may be interposed between the first substrate 100 and the stacked first and second mold structures MS1 and MS2. The source structure 300 may include, e.g., impurity-doped polysilicon or metal.

In some embodiments, the channel structure CH may penetrate the source structure 300 and be connected to the first substrate 100. For example, a lower part of the channel structure CH may penetrate the source structure 300 and be buried in the first substrate 100. The source structure 300 may be formed to be connected to the semiconductor pattern 130 of the channel structure CH. For example, the source structure 300 may penetrate the information storage film 132 and be connected to the semiconductor pattern 130.

In some embodiments, a part of the source structure 300 adjacent to the semiconductor pattern 130 may have a shape protruding toward the information storage film 132. For example, in the region adjacent to the semiconductor pattern 130, a length of the source structure 300 extending in the third direction Z may be further enlarged. This may be due to the properties of an etching process which removes a part of the information storage film 132 to form the source structure 300.

The bit line BL may be formed on the first and second mold structures MS1 and MS2, e.g., the stacked first and second mold structures MS1 and MS2 may be between the first substrate 100 and the bit line BL. For example, the bit line BL may be formed on the second to fourth interlayer insulating films 142, 144, and 146 which are sequentially stacked on the first interlayer insulating film 140. The bit line BL extends in the second direction Y and may be connected to a plurality of channel structures CH. For example, the bit line BL may be connected to the plurality of channel structures CH through a bit line contact 160. The bit line contact 160 may penetrate, e.g., the third and fourth interlayer insulating films 144, 146 and electrically connect the bit line BL and the channel structure CH.

The block separation region WLC is formed, e.g., to extend continuously, in the cell array region CELL and the extension region EXT, and may cut the plurality of gate electrodes ECL, GSL, WL11 to WL1n, WL21 to WL2n, and SSL. For example, the block separation region WLC may extend in the first direction X and cut the first and second mold structures MS1 and MS2.

The block separation region WLC may cut the cell array region CELL and the extension region EXT and form a plurality of memory blocks. For example, the block separation region WLC may extend long, e.g., lengthwise, in the first direction X and completely cut the first and second mold structures MS1 and MS2. The first and second mold structures MS1 and MS2 that are cut by two adjacent block separation regions WLC may define a single memory block.

In some embodiments, a cell gate cut region CAC may be formed between two adjacent block separation regions WLC, as illustrated in FIG. 2. The cell gate cut region CAC may be formed, e.g., only, in the cell array region CELL and cut the plurality of gate electrodes ECL, GSL, WL11 to WL1n, WL21 to WL2n, and SSL. For example, the cell gate cut region CAC may extend in the first direction X and cut the first and second mold structures MS1 and MS2 in the cell array region CELL.

The cell gate cut region CAC may form a plurality of sections I, II, and III in the memory block of the cell array region CELL. For example, cell gate cut regions CAC of two rows each extending in the first direction X may be formed in the two adjacent block separation regions WLC. Three sections (e.g., first to third section I, II, and III) may be defined in the two adjacent block separation regions WLC, accordingly.

In some embodiments, an extension gate cut region CNC may be formed between the two adjacent block separation regions WLC. The extension gate cut region CNC may be formed, e.g., only, in the extension region EXT and cut the plurality of gate electrodes ECL, GSL, WL11 to WL1n, WL21 to WL2n, and SSL. For example, the extension gate cut region CNC may extend in the first direction X and cut the first and second mold structures MS1 and MS2 in the extension region EXT.

In some embodiments, at least a part of the extension gate cut region CNC may be arranged to overlap the cell gate cut region CAC in the first direction X, e.g., the extension gate cut region CNC may be aligned with the cell gate cut region CAC in the first direction X. For example, the extension gate cut regions CNC of two rows each extending in the first direction X may be formed in the two adjacent block separation regions WLC. Similarly to the cell gate cut region CAC of two rows, the extension gate cut region CNC of two rows may define three sections (e.g., first to third section I, II, and III) in the two adjacent block separation regions WLC.

Although all the extension gate cut regions CNC are only shown as overlapping the cell gate cut region CAC in the first direction X, this is only an example. For example, a part of the extension gate cut region CNC may be arranged to overlap a string cut region SC to be described later in the first direction X.

The block separation region WLC, the cell gate cut region CAC, and the extension gate cut region CNC may each include a cut pattern 150. The cut pattern 150 may include, e.g., at least one of silicon oxide, silicon nitride, silicon oxynitride and a low dielectric constant (low-k) material having a dielectric constant lower than silicon oxide.

In some embodiments, the block separation region WLC, the cell gate cut region CAC, and the extension gate cut region CNC may be formed at the same level. As used herein, the expression "formed at the same level" means formation by the same fabricating process. For example, the insulating materials that constitute the block separation region WLC, the cell gate cut region CAC, and the extension gate cut region CNC may be identical to each other.

In some embodiments, the block separation region WLC may include a conductive material. For example, the block separation region WLC may include a conductive pattern and a spacer film that separates the first and second mold structures MS1 and MS2 from the conductive pattern. The block separation region WLC including the conductive pattern may be connected to an impurity region in the first substrate 100, and may be provided as a common source line (e.g., CSL of FIG. 1) of the semiconductor memory device.

In some embodiments, the string cut region SC may be formed in first and second the mold structures MS1 and MS2 of the cell array region CELL. The string cut region SC may be interposed between the block separation regions WLC and cut the string selection line SSL of the first and second mold structures MS1 and MS2. For example, the string cut region SC may extend in the first direction X and cut the string selection line SSL.

In some embodiments, a part of the string cut region SC may be placed to overlap the cell gate cut region CAC. For example, the string cut region SC may be formed between the first section I and the second section II, and between the second section II and the third section III. The string cut region SC arranged to overlap the cell gate cut region CAC may form a plurality of sections I, II, and III in the memory block of the cell array region CELL, together with the cell gate cut region CAC. As a result, the string selection line SSL of the first section I and the string selection line SSL of the second section II may be electrically separated and controlled separately. The string selection line SSL of the second section II and the string selection line SSL of the third section III may be electrically separated and controlled separately.

In some embodiments, the other part of the string cut region SC may be interposed between the block separation region WLC and the cell gate cut region CAC. For example, the string cut region SC may be formed to cut each of the first to third sections I, II, and III. Accordingly, each of the first to third sections I, II, and III may provide two string selection lines SSL that are electrically separated and controlled separately. That is, six string selection lines SSL may be formed in the two adjacent block separation regions WLC as an example.

A gate contact 162 connected to the respective gate electrodes ECL, GSL, WL11 to WL1n, WL21 to WL2n, and SSL may be formed in the extension region EXT. For example, the gate contact 162 penetrates the first to fourth interlayer insulating film 140, 142, 144, and 146, and may be connected to each of the gate electrodes ECL, GSL, WL11 to WL1n, WL21 to WL2n, and SSL. In some embodiments, the width of the gate contact 162 may decrease toward the first substrate 100.

The plurality of through-vias and 180a,180b may be spaced apart from each other and may penetrate the first and second mold structures MS1 and MS2. For example, each of the through-vias 180a,180b may extend in the third direction Z and penetrate the first and second mold structures MS1 and MS2.

In some embodiments, each of the through-vias 180a, 180b may be in contact with, e.g., both, the first and second mold structures MS1 and MS2. For example, a plurality of through-via trenches 180ta,180tb extending in the third direction Z and penetrating the first and second mold structures MS1 and MS2 may be formed. The through-vias 180a,180b may be formed in the through-via trenches 180ta, 180tb and may be in contact with the first and second mold structures MS1 and MS2.

The through-vias 180a,180b may each include through-spacer films 182a,182b, respectively, and through-conductive patterns 184a,184b, respectively. The through-spacer films 182a,182b may separate the through-conductive patterns 184a,184b from the first and second mold structures MS1 and MS2. For example, the through-spacer films 182a,182b may conformally extend along the profile of the side surfaces of the respective through-via trenches 180ta, 180tb. The through-conductive patterns 184a,184b are formed on the through-spacer films 182a,182b and may fill each through-via trenches 180ta,180tb. That is, the through-spacer films 182a,182b may surround the side surfaces of the through-conductive patterns 184a,184b.

The through-spacer films 182a,182b may each include an insulating material. Therefore, the through-spacer films 182a,182b may electrically insulate the through-conductive patterns 184a,184b from the first and second mold structures MS1 and MS2. The through-spacer films 182a,182b may each include, e.g., at least one of silicon oxide, silicon nitride, silicon oxynitride and a low dielectric constant (low-k) material having a dielectric constant lower than silicon oxide. The through-conductive patterns 184a,184b may each include, e.g., metal materials such as tungsten (W), copper (Cu), cobalt (Co), and nickel (Ni).

In some embodiments, each width of the through-vias 180a,180b may decrease toward the first substrate 100. Here, the width means a width in a direction (e.g., the first direction X and/or the second direction Y) parallel to the upper surface (e.g., the first surface 100a) of the first substrate 100. For example, each width of the through-via trenches 180ta,180tb may decrease toward the first substrate 100. Therefore, the width of the through-conductive patterns 184a,184b may also decrease toward the first substrate 100.

A first portion of the through-vias 180a,180b may be connected to a first contact via 190 to be described later, and a second portion of the through-vias 180a,180b may not be connected to the first contact via 190 to be described later. For example, the first portion of the through-vias 180a,180b may include a first through-via 180a connected to the first contact via 190, and a second through-via 180b not connected to the first contact via 190. The first through-via 180a may be formed in the first through-via trench 180ta. The first through-via 180a may include a first conductive pattern 184a and a first spacer film 182a. The second through-via 180b may be formed in the second through-via trench 180tb. The second through-via 180b may include a second conductive pattern 184b and a second spacer film 182b.

In FIG. 3, although two first through-vias 180a are shown as only being interposed between two second through-vias 180b, this is only an example. If necessary, the number and placement of the first through-vias 180a and the number and placement of the second through-vias 180b may be various.

The second spacer film 182b may separate the second conductive pattern 184b from the first substrate 100 and the first and second mold structures MS1 and MS2. For example, the second spacer film 182b may conformally extend along the profiles of the side surface and the lower surface of the second through-via trench 180tb. Accordingly, the second conductive pattern 184b may be electrically insulated not only from the first and second mold structures MS1 and MS2 but also from the first substrate 100.

In some embodiments, a part of the second through-via trench 180tb may be formed inside the first substrate 100. For example, the second through-via trench 180tb may be formed by etching a part of the first substrate 100. Accordingly, a part of the second through-via 180b may protrude from the first and second mold structures MS1 and MS2, e.g., into the first substrate 100. For example, as shown in FIGS. 3 and 5a, the second through-via 180b may protrude by a first distance D1 along the third direction Z from the first and second mold structures MS1 and MS2 into the first substrate 100, e.g., the length of the portion of the second through-via 180b in the first substrate 100 along the third direction Z may equal the first distance D1.

The first contact via 190 may penetrate the first substrate 100. For example, the first contact via 190 may extend in the third direction Z and penetrate the, e.g., entire thickness of, first substrate 100. The first contact via 190 may be connected to a part of the plurality of through-vias 180a,180b. For example, the first contact via 190 may penetrate the first substrate 100 and be connected to, e.g., all, the first through-via 180a.

In some embodiments, the first contact via 190 may be in contact with the first substrate 100. For example, a first contact via trench 190t that extends in the third direction Z and penetrates the first substrate 100 may be formed. The first contact via 190 may be formed in the first contact via trench 190t and be in contact with the first substrate 100.

The first contact via 190 may include a third spacer film 192 and a third conductive pattern 194. The third spacer film 192 may separate the third conductive pattern 194 from the first substrate 100. For example, the third spacer film 192 may conformally extend along the profile of the side surface of the first contact via trench 190t. The third conductive pattern 194 may be formed on the third spacer film 192 to fill the first contact via trench 190t. That is, the third spacer film 192 may surround the side surface of the third conductive pattern 194.

The third conductive pattern 194 of the first contact via 190 may be, e.g., directly, connected to the first conductive pattern 184*a* of the first through-via 180*a*. Accordingly, the first through-via 180*a* and the first contact via 190 may be electrically connected to each other. For example, the first spacer film 182*a* may not extend along the lower surface of the first through-via trench 180*ta*, e.g., may not extend along a surface of the first through-via trench 180*ta* that faces the first substrate 100, and the first conductive pattern 184*a* may extend along the lower surface of the first through-via trench 180*ta*. The third spacer film 192 may not extend along the lower surface of the first contact via trench 190*t*, e.g., may not extend along a surface of the first contact via trench 190*t* that faces the first mold structure MS1, and the third conductive pattern 194 may extend along the lower surface of the first contact via trench 190*t*. The first contact via trench 190*t* may penetrate the first substrate 100 and expose the first through-via trench 180*ta*. Therefore, the first conductive pattern 184*a* may be exposed by the first contact via trench 190*t*, and the first conductive pattern 184*a* may be, e.g., directly, connected to the third conductive pattern 194.

In FIGS. 3 and 5*a*, although an interface between the first through-via 180*a* and the first contact via 190 is shown as only being placed on the same plane as the first surface 100*a* of the first substrate 100, this is only an example. For example, the interface between the first through-via 180*a* and the first contact via 190 may be lower than the first surface 100*a* or higher than the first surface 100*a*.

In some embodiments, the width of the first contact via 190 may decrease from the second surface 100*b* of the first substrate 100 toward the first surface 100*a* of the first substrate 100. For example, the width of the first contact via trench 190*t* may decrease toward the first and second mold structures MS1 and MS2. Accordingly, the width of the third conductive pattern 194 may also decrease toward the first and second mold structures MS1 and MS2.

In some embodiments, the width of the first contact via 190 may be formed to be greater than the width of the first through-via 180*a*. For example, as shown in FIGS. 3 and 5*a*, the width W1 of the first contact via trench 190*t* along the first direction X may be greater than the width W2 of the first through-via trench 180*ta* along the first direction X, as measured on the first surface 100*a* of the first substrate 100. For example, as shown in FIGS. 3 and 5*a*, the first contact via trench 190*t* may overlap the entirety of the first through-via trench 180*ta* along the vertical direction, e.g., central axes of the first contact via trench 190*t* and the first through-via trench 180*ta* may be vertically aligned. Therefore, the first contact via trench 190*t* may expose both the first spacer film 182*a* and the first conductive pattern 184*a*.

In FIGS. 3 and 5*a*, although the width of the third conductive pattern 194 is shown as being greater than the width W2 of the first through-via trench 180*ta*, this is only an example. For example, the width of the third conductive pattern 194 may be smaller than the width W2 of the first through-via trench 180*ta*, and may be the same as the width W2 of the first through-via trench 180*ta*.

As shown in FIG. 5*b*, in the semiconductor memory device according to some embodiments, a part of the first through-via 180*a* may protrude from the stacked first and second mold structures MS1 and MS2 into the first contact via 190. That is, a part of the first conductive pattern 184*a* may have a form protruding from the stacked first and second mold structures MS1 and MS2 into the first contact via 190, e.g., into the third conductive pattern 194.

In some embodiments, the first conductive pattern 184*a* may have a form that protrudes from, e.g., beyond, the first spacer film 182*a* toward the first contact via 190. For example, as shown in FIG. 5*b*, the upper surface of the first conductive pattern 184*a* may be located to be higher than the upper surface of the first spacer film 182*a*, e.g., relative to the erasure control line ECL. In some embodiments, a part of the protruding first conductive pattern 184*a* may be buried in the third conductive pattern 194. For example, the third conductive pattern 194 may surround the side surface of a part of the protruding first conductive pattern 184*a*.

The third spacer film 192 may include an insulating material. Therefore, the third spacer film 192 may electrically insulate the third conductive pattern 194 from the first substrate 100. The third spacer film 192 may include, e.g., at least one of silicon oxide, silicon nitride, silicon oxynitride and a low dielectric constant (low-k) material having a dielectric constant lower than silicon oxide. The third conductive pattern 194 may include, e.g., metal materials such as tungsten (W), copper (Cu), cobalt (Co), and nickel (Ni).

Referring back to FIG. 3, an upper insulating film 102 that covers the second surface 100*b* of the first substrate 100 may be formed. In some embodiments, the first contact via 190 may penetrate the upper insulating film 102 and the first substrate 100, and may be connected to the first through-via 180*a*. For example, the first contact via trench 190*t* may penetrate the upper insulating film 102 and the first substrate 100 and expose the first through-via 180*a*.

The first input-output pad 30 may be formed on the second surface 100*b* of the first substrate 100. The first input-output pad 30 may be connected to the first contact via 190. For example, the first input-output pad 30 may be formed on the upper insulating film 102 and may be connected to the first contact via 190. The first input-output pad 30 may be connected to at least one (e.g., a third the circuit element PT3) of the circuit elements PT1 to PT5 to be described later through the first contact via 190 and the first through-via 180*a*.

The first wiring structure 10 may be formed on the first surface 100*a* of the first substrate 100. For example, the first wiring structure 10 may cover the fourth interlayer insulating film 146, e.g., the fourth interlayer insulating film 146 may be between the first wiring structure 10 and the first substrate 100. The first wiring structure 10 may include a first connection wiring 12 and a first connection via 14. For example, a first inter-wiring insulating film 104 that covers the bit line BL may be formed on the fourth interlayer insulating film 146. The first connection wiring 12 and the first connection via 14 may be formed in the first inter-wiring insulating film 104, and may be electrically connected. In some embodiments, at least a part of the first wiring structure 10 may be exposed from the surface of the first inter-wiring insulating film 104.

The second substrate 200 may include, e.g., a semiconductor substrate such as a silicon substrate, a germanium substrate or a silicon-germanium substrate. Alternatively, the second substrate 200 may include, e.g., a silicon-on-insulator (SOI) substrate, a germanium-on-insulator (GOI) substrate, or the like.

The second substrate 200 may be on the first surface 100*a* of the first substrate 100. For example, the second substrate 200 may include a third surface 200*a* facing the first surface 100*a*, and a fourth surface 200*b* opposite to the third surface 200*a*. For example, the first inter-wiring insulating film 104 may be between the first substrate 100 and the second substrate 200.

In some embodiments, the plurality of circuit elements PT1 to PT5 may be formed on the third surface 200*a* of the second substrate 200. The circuit elements PT1 to PT5 may provide peripheral circuits (e.g., a decoder circuit 1110, a page buffer 1120, a logic circuit 1130, and the like of FIG.

22) that control the operation of each memory cell. For example, the first circuit element PT1 may provide a page buffer, the second circuit element PT2 may provide a decoder circuit, and the third to fifth circuit elements PT3 to PT5 may provide logic circuits.

Each of the circuit elements PT1 to PT5 may include, e.g., a transistor. For example, each of the circuit elements PT1 to PT5 may also include not only various active elements, e.g., transistors, but also various passive elements, e.g., a capacitor, a resistor, and an inductor.

The second wiring structure 20 may be formed on the third surface 200a of the second substrate 200. For example, the second wiring structure 20 may cover, e.g., electrically connect to, the circuit elements PT1 to PT5. The second wiring structure 20 may include a second connection wiring 22 and a second connection via 24. For example, a second inter-wiring insulating film 204 that covers the circuit elements PT1 to PT5 may be formed on the second substrate 200. The second connection wiring 22 and the second connection via 24 may be formed in the second inter-wiring insulating film 204, and may be electrically connected. In some embodiments, at least a part of the second wiring structure 20 may be exposed from the surface of the second inter-wiring insulating film 204.

In some embodiments, the second inter-wiring insulating film 204 may be attached to the first inter-wiring insulating film 104. As the first inter-wiring insulating film 104 and the second inter-wiring insulating film 204 are attached, the first wiring structure 10 and the second wiring structure 20 may be electrically connected. For example, the first connection wiring 12 exposed from the first inter-wiring insulating film 104 may be in contact with the second connection wiring 22 exposed from the second inter-wiring insulating film 204. The first connection wiring 12 and the second connection wiring 22 may be electrically connected, e.g., by a copper-copper bonding (Cu to Cu) bonding process.

In some embodiments, the bit line BL may be connected to a first circuit element PT1 on the second substrate 200. For example, the bit line BL may be connected to the first circuit element PT1 through the first wiring structure 10 and the second wiring structure 20.

In some embodiments, the gate electrodes ECL, GSL, WL11 to WL1n, WL21 to WL2n, and SSL may be connected to the second circuit element PT2 on the second substrate 200. For example, a third connection wiring 170 connected to the gate contact 162 may be formed in the first inter-wiring insulating film 104. The third connection wiring 170 may be connected to the second circuit element PT2 through the first wiring structure 10 and the second wiring structure 20.

In some embodiments, the first through-via 180a may be connected to a third circuit element PT3 on the second substrate 200. For example, a fourth connection wiring 172 may be formed in the first inter-wiring insulating film 104. The fourth connection wiring 172 may be connected to at least a part of the through-vias 180a,180b through the connection contact 164. The connection contact 164 may penetrate, e.g., the third and fourth interlayer insulating films 144,146, and may electrically connect the first conductive pattern 184a of the first through-via 180a and the fourth connection wiring 172. The fourth connection wiring 172 may be connected to the third circuit element PT3 through the first wiring structure 10 and the second wiring structure 20. Accordingly, the first through-via 180a may connect the first input-output pad 30 and the third circuit element PT3.

In some embodiments, the second through-via 180b may be a dummy through-via. For example, the second through-via 180b may not connect the first input-output pad 30 to the third circuit element PT3.

In some embodiments, a lower insulating film 202 that covers the fourth surface 200b of the second substrate 200 may be formed.

The semiconductor memory device according to some embodiments may improve the degree of integration by including the through-vias 180a,180b. That is, the first through-vias 180a that connect the first input-output pad 30 and the third circuit element PT3 may be formed to penetrate the first and second mold structures MS1 and MS2. Accordingly, since another, e.g., additional, region for forming the through-vias (e.g., a region around or other than the first and second mold structures MS1 and MS2) is not required, a semiconductor memory device with an improved degree of integration may be provided.

Further, in the semiconductor memory device according to some embodiments, the first through-vias 180a may be selectively connected to the first input-output pad 30 through the first contact via 190. For example, as described above, the first through-vias 180a may be connected to the first contact via 190, while the second through-via 180b may not be connected to the first contact via 190, thereby providing a semiconductor memory device that is easy to design.

Figure 6:
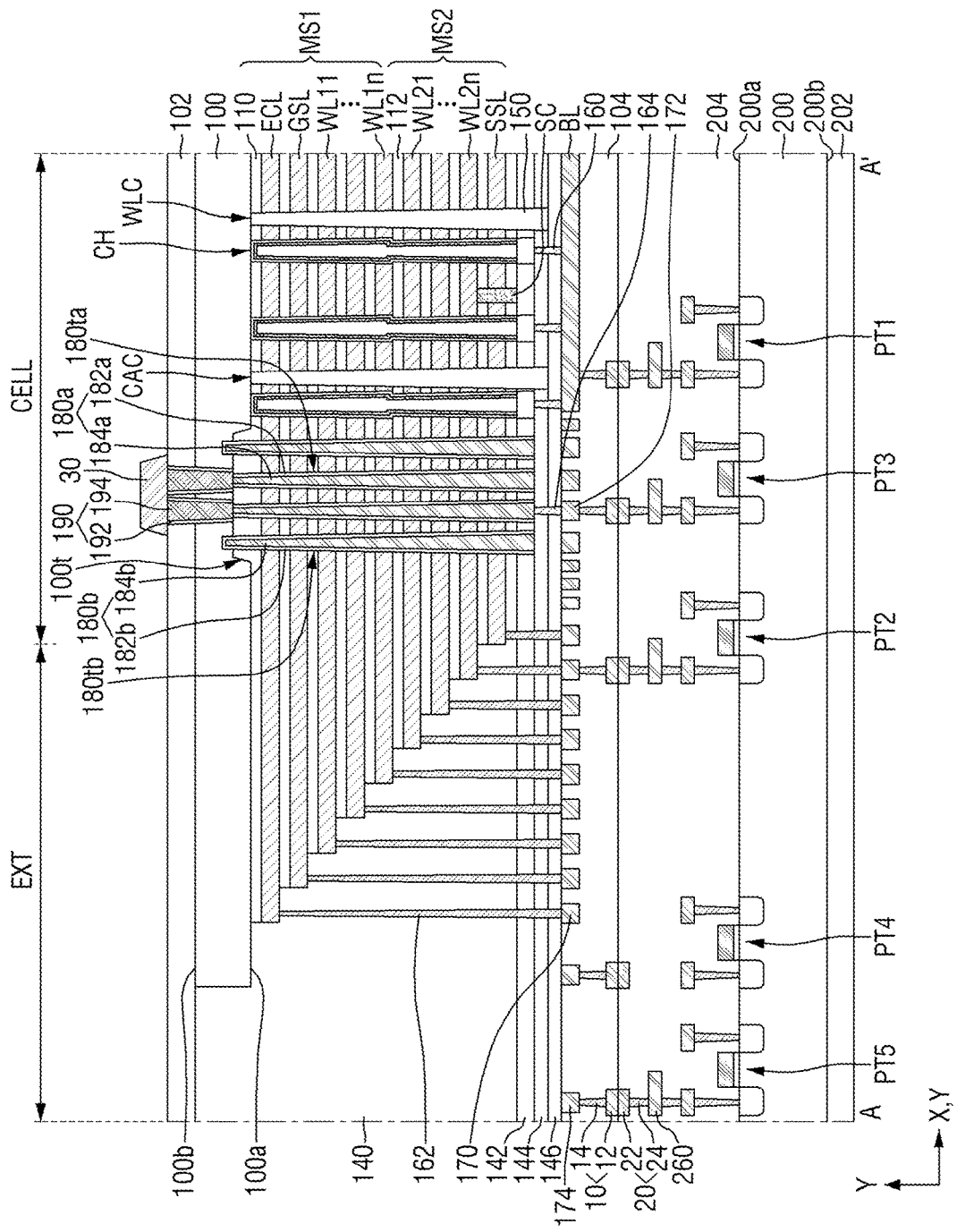
FIG. 6 is a cross-sectional view of a semiconductor memory device according to some embodiments.

FIG. 6 is a cross-sectional view for explaining the semiconductor memory device according to some embodiments. For convenience of explanation, repeated parts of the contents explained above using FIGS. 1 to 5b will be only briefly explained or omitted. For reference, FIG. 6 is a cross-sectional view along line A-A' of FIG. 2.

Referring to FIGS. 2 and 6, in the semiconductor memory device according to some embodiments, the first substrate 100 may include a substrate trench 100t. The substrate trench 100t may extend from the first surface 100a of the first substrate 100. For example, as shown in FIG. 6, the lower surface of the substrate trench 100t may be higher than the first surface 100a of the first substrate 100, e.g., relative to the first mold structure MS1.

In some embodiments, the through-vias 180a,180b may be placed in the substrate trench 100t. That is, the through-vias 180a, 80b may overlap the substrate trench 100t in the third direction Z. The through-via trenches 180ta,180tb may expose the lower surface of the substrate trench 100t.

Further, the first contact via 190 may be placed in the substrate trench 100t. That is, the first contact via 190 may overlap the substrate trench 100t in the third direction Z. In some embodiments, the first contact via trench 190t may expose the lower surface of the substrate trench 100t. Therefore, the through-vias 180a, 80b which are more easily connected to the first contact via 190 may be provided.

In FIG. 6, although the interface between the first through-via 180a and the first contact via 190 is shown as only being placed on the same plane as the lower surface of the substrate trench 100t, this is only an example. For example, the interface between the first through-via 180a and the first contact via 190 may lower than the lower surface of the substrate trench 100t or higher than the lower surface of the substrate trench 100t.

Figure 7:
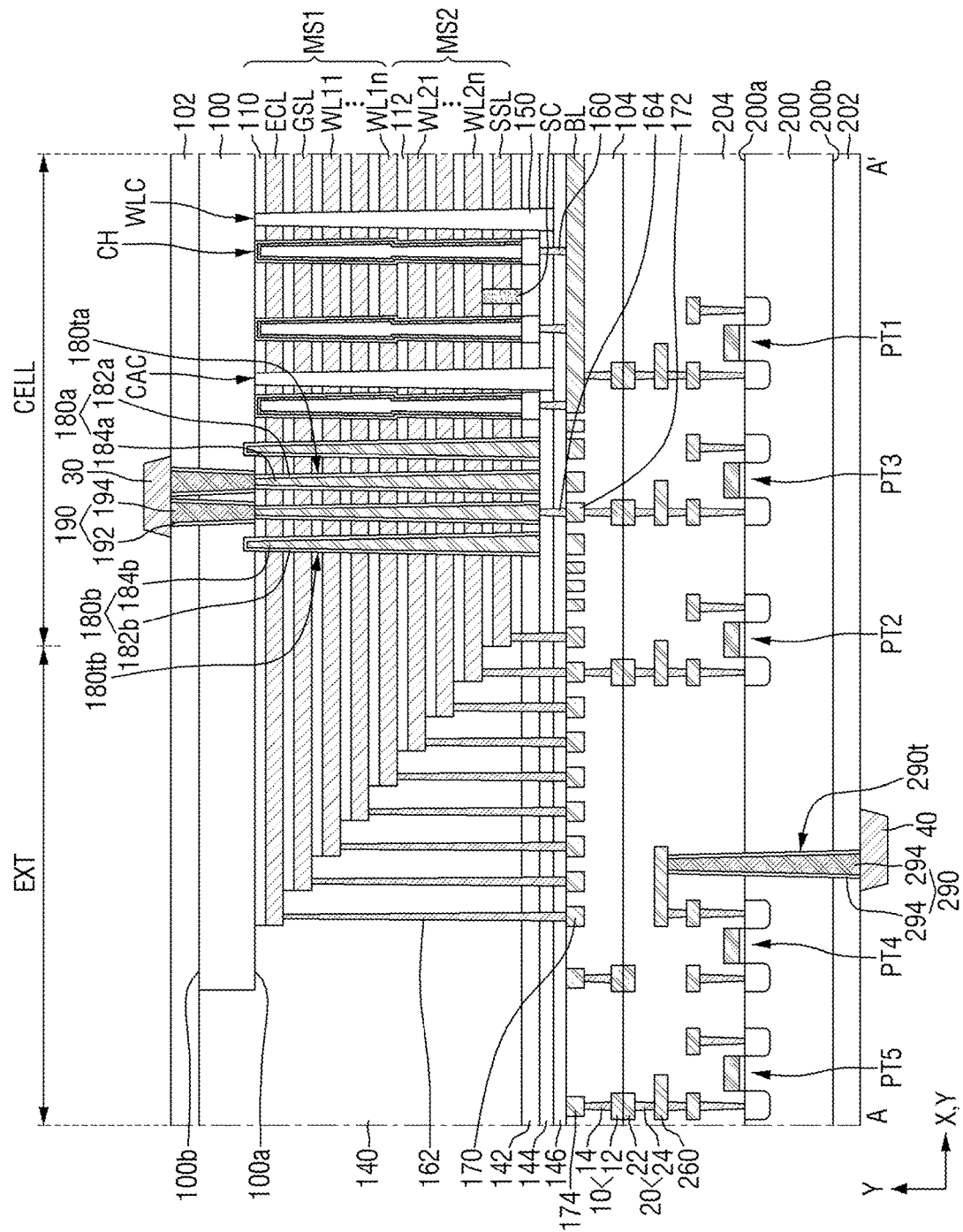
FIG. 7 is a cross-sectional view of a semiconductor memory device according to some embodiments.

FIG. 7 is a cross-sectional view of a semiconductor memory device according to some embodiments. For convenience of explanation, repeated parts of contents explained above using FIGS. 1 to 5b will be only briefly explained or omitted. For reference, FIG. 7 is a cross-sectional view along line A-A' of FIG. 2.

Referring to FIGS. 2 and 7, a semiconductor memory device according to some embodiments may further include a second contact via 290 and a second input-output pad 40.

The second contact via 290 may penetrate the second substrate 200. For example, the second contact via 290 may extend in the third direction Z and penetrate the second substrate 200.

In some embodiments, the second contact via 290 may be in contact with the second substrate 200. For example, a second contact via trench 290t that extends in the third direction Z and penetrates the second substrate 200 may be formed. The second contact via 290 may be formed in the second contact via trench 290t and may be in contact with the second substrate 200.

The second contact via 290 may include a fourth spacer film 292 and a fourth conductive pattern 294. The fourth spacer film 292 may separate the fourth conductive pattern 294 from the second substrate 200. For example, the fourth spacer film 292 may conformally extend along the profile of the side surfaces of the second contact via trench 290t. The fourth conductive pattern 294 may be formed on the fourth spacer film 292 and may fill the second contact via trench 290t. That is, the fourth spacer film 292 may surround the side surfaces of the fourth conductive pattern 294. In some embodiments, the second contact via 290 may be connected to at least one (e.g., the fourth circuit element PT4) of the circuit elements PT1 to PT5 on the second substrate 200.

The second input-output pad 40 may be formed on the fourth surface 200b of the second substrate 200. The second input-output pad 40 may be connected to the second contact via 290. For example, the second input-output pad 40 may be formed on the lower insulating film 202 and connected to the second contact via 290. The second input-output pad 40 may be connected to the fourth circuit element PT4 through the second contact via 290.

Figure 8:
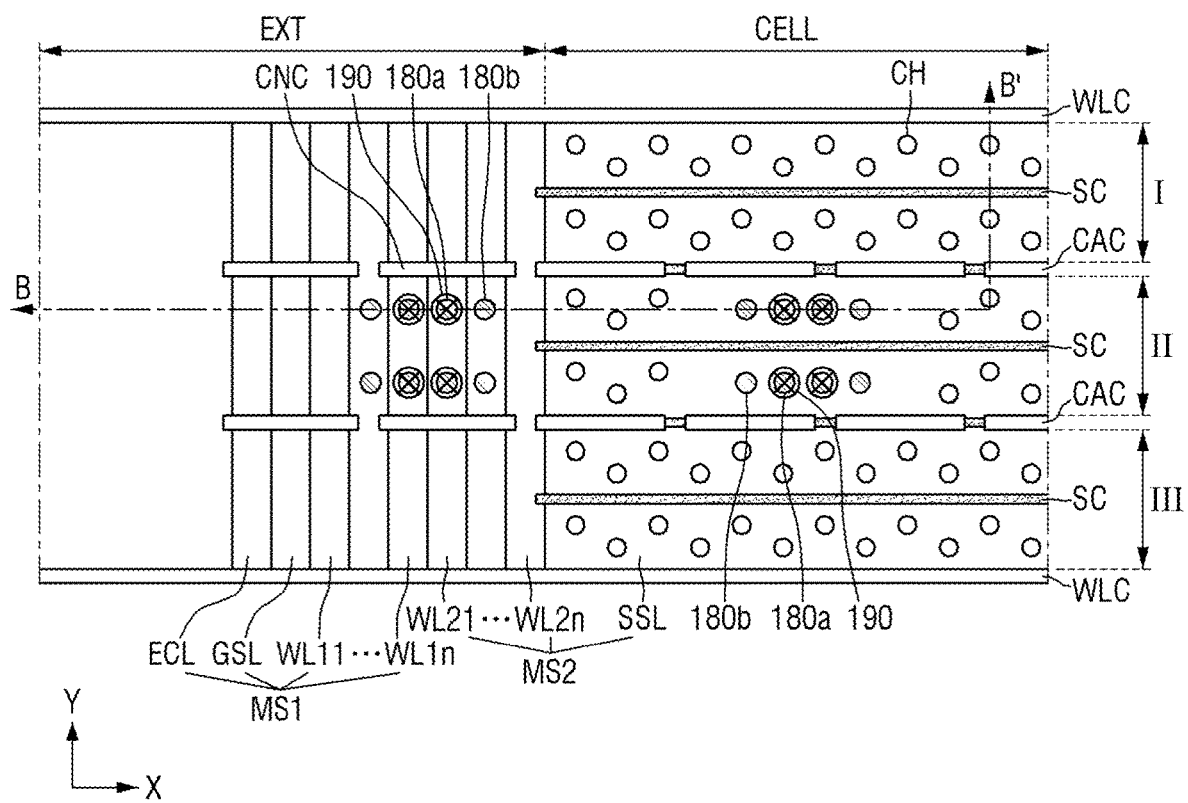
FIG. 8 is a schematic layout diagram of a semiconductor memory device according to some embodiments.
Figure 9:
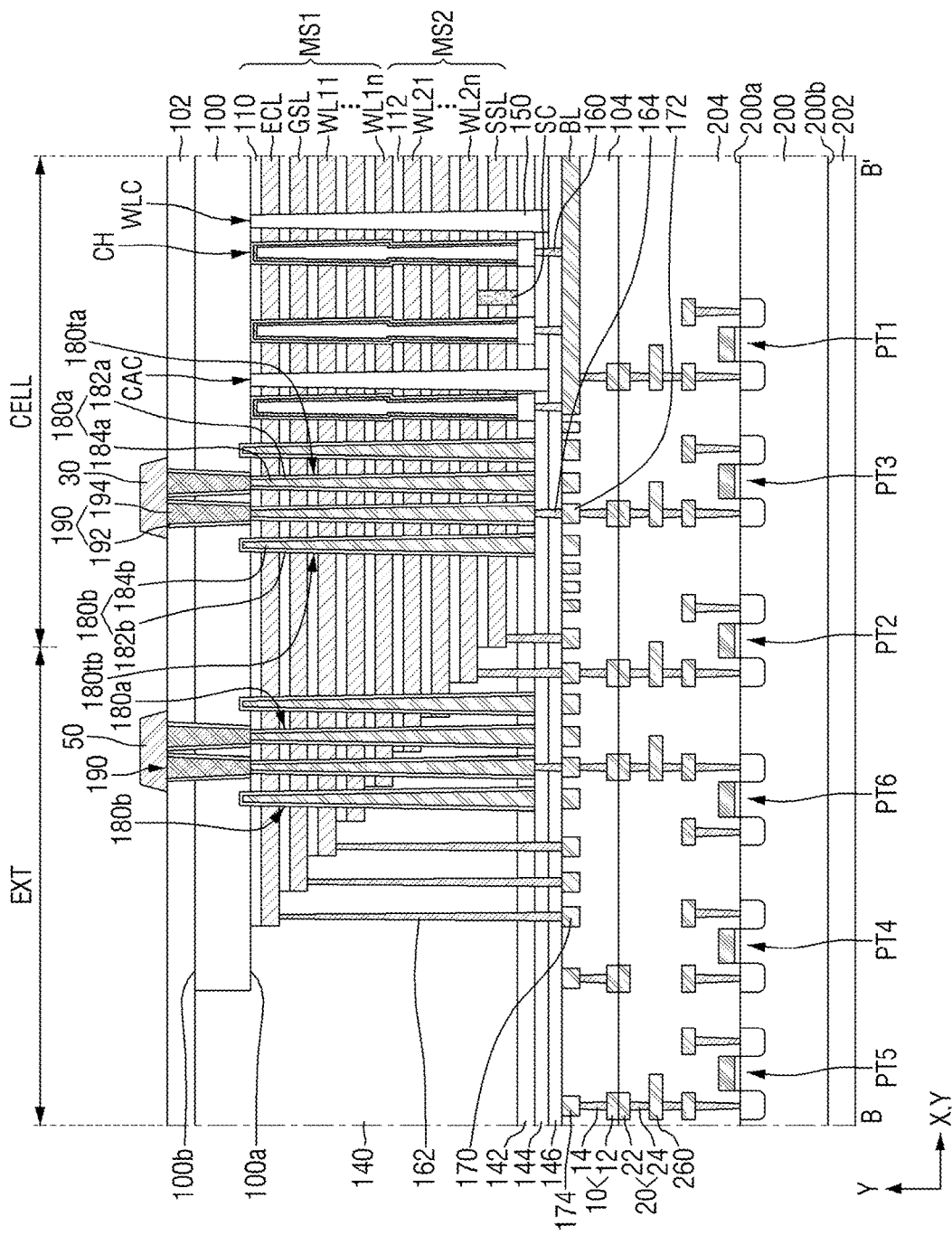
FIG. 9 is a cross-sectional view taken along line B-B' of FIG. 8.

FIG. 8 is a schematic layout diagram of a semiconductor memory device according to some embodiments. FIG. 9 is a cross-sectional view along a line B-B' of FIG. 8. For convenience of explanation, repeated parts of contents explained above using FIGS. 1 to 5b will be only briefly explained or omitted.

Referring to FIGS. 8 and 9, in the semiconductor memory device according to some embodiments, at least a part of the through-vias 180a,180b may be placed in the extension region EXT. For example, at least a part of the plurality of first through-vias 180a and at least a part of the plurality of second through-vias 180b may be placed in the extension region EXT.

The through-vias 180a,180b placed in the extension region EXT penetrate some parts of the gate electrodes ECL, GSL, WL11 to WL1n, WL21 to WL2n, and SSL, and may not penetrate other parts of the gate electrodes ECL, GSL, WL11 to WL1n, WL21 to WL2n, and SSL. As an example, as shown, one of the first through-vias 180a penetrates the first gate electrode ECL, GSL, and WL11 to WL1n, and may not penetrate the second gate electrode WL21 to WL2n, and SSL.

In some embodiments, a third input-output pad 50 may be formed in the extension region EXT. The third input-output pad 50 may be formed on the second surface 100b of the first substrate 100. For example, the third input-output pad 50 may be formed on the upper insulating film 102. In some embodiments, the third input-output pad 50 may be formed at the same level as the first input-output pad 30.

The third input-output pad 50 may be connected to the first contact via 190 in the extension region EXT. The third input-output pad 50 may be connected with at least one (e.g., a sixth circuit element PT6) of the circuit elements PT1 to PT6 through the first contact via 190 and the first through-via 180a.

Figure 22:
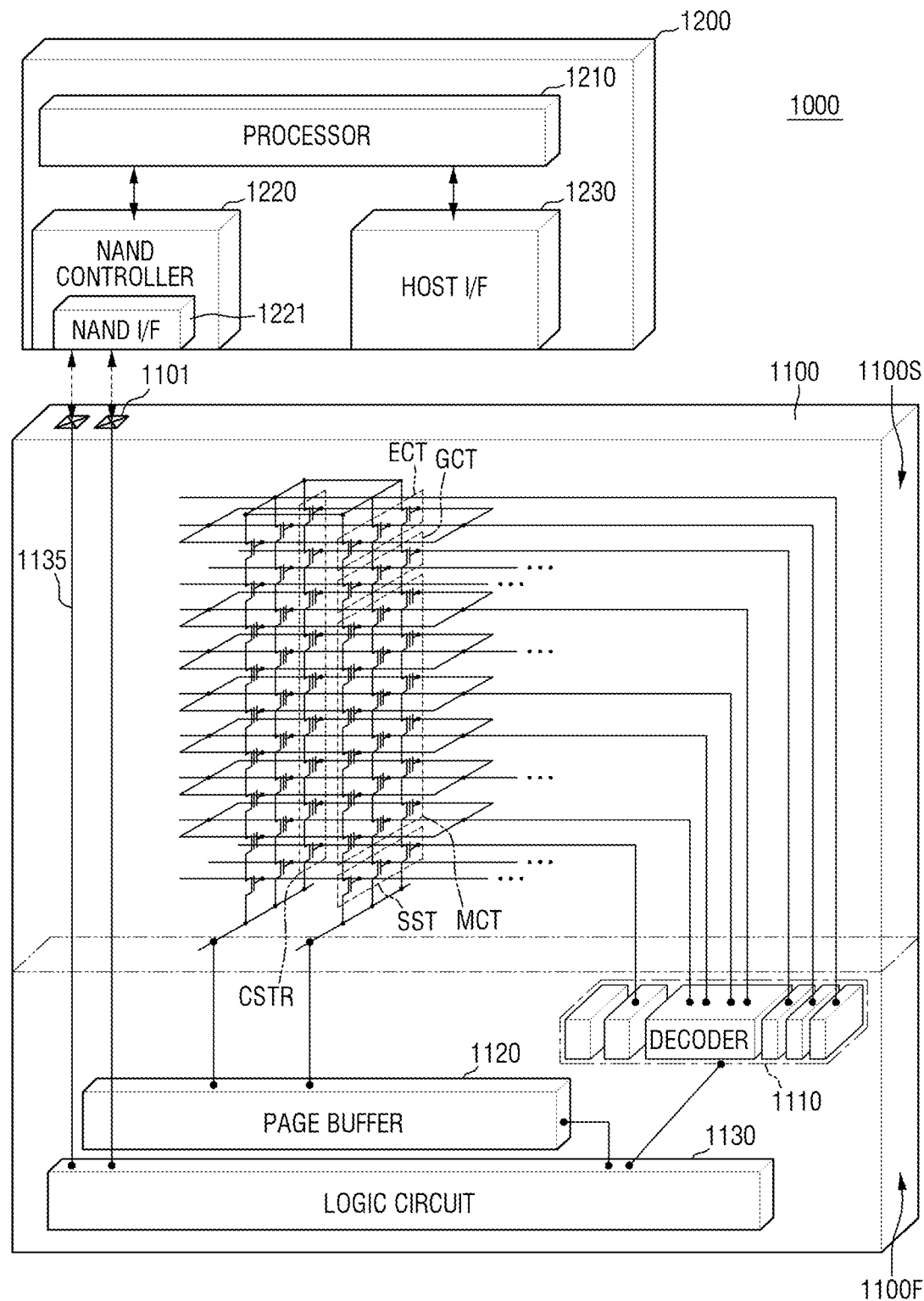
FIG. 22 is a schematic block diagram of an electronic system according to some embodiments.

The sixth circuit element PT6 may provide peripheral circuits (e.g., a page buffer 1120, a decoder circuit 1110, a logic circuit 1130, and the like of FIG. 22) that control the operation of each memory cell. For example, the sixth circuit element PT6 may provide a logic circuit.

In FIGS. 8 and 9, although the through-vias 180a,180b are shown as being placed in both the cell array region CELL and the extension region EXT, this is only an example. For example, the through-vias 180a,180b may be placed only in the extension region EXT.

Figure 10:
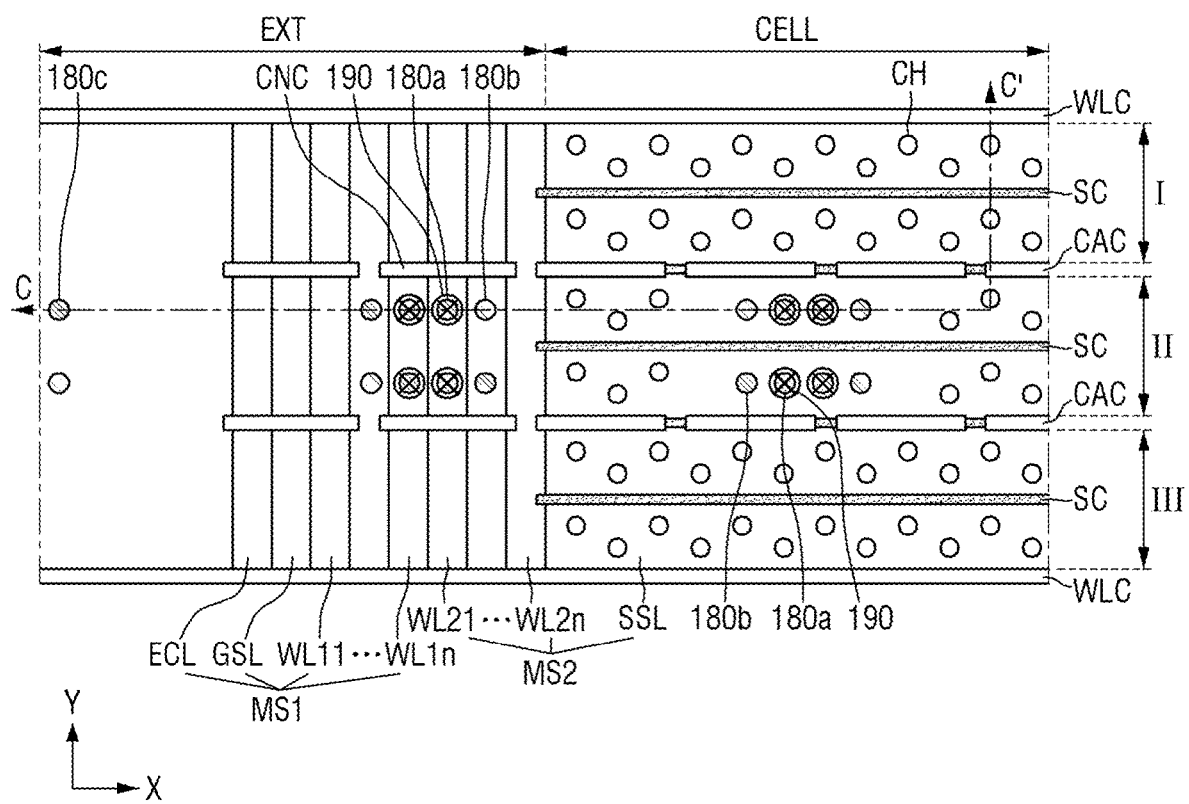
FIG. 10 is a schematic layout diagram for explaining of a semiconductor memory device according to some embodiments.
Figure 11:
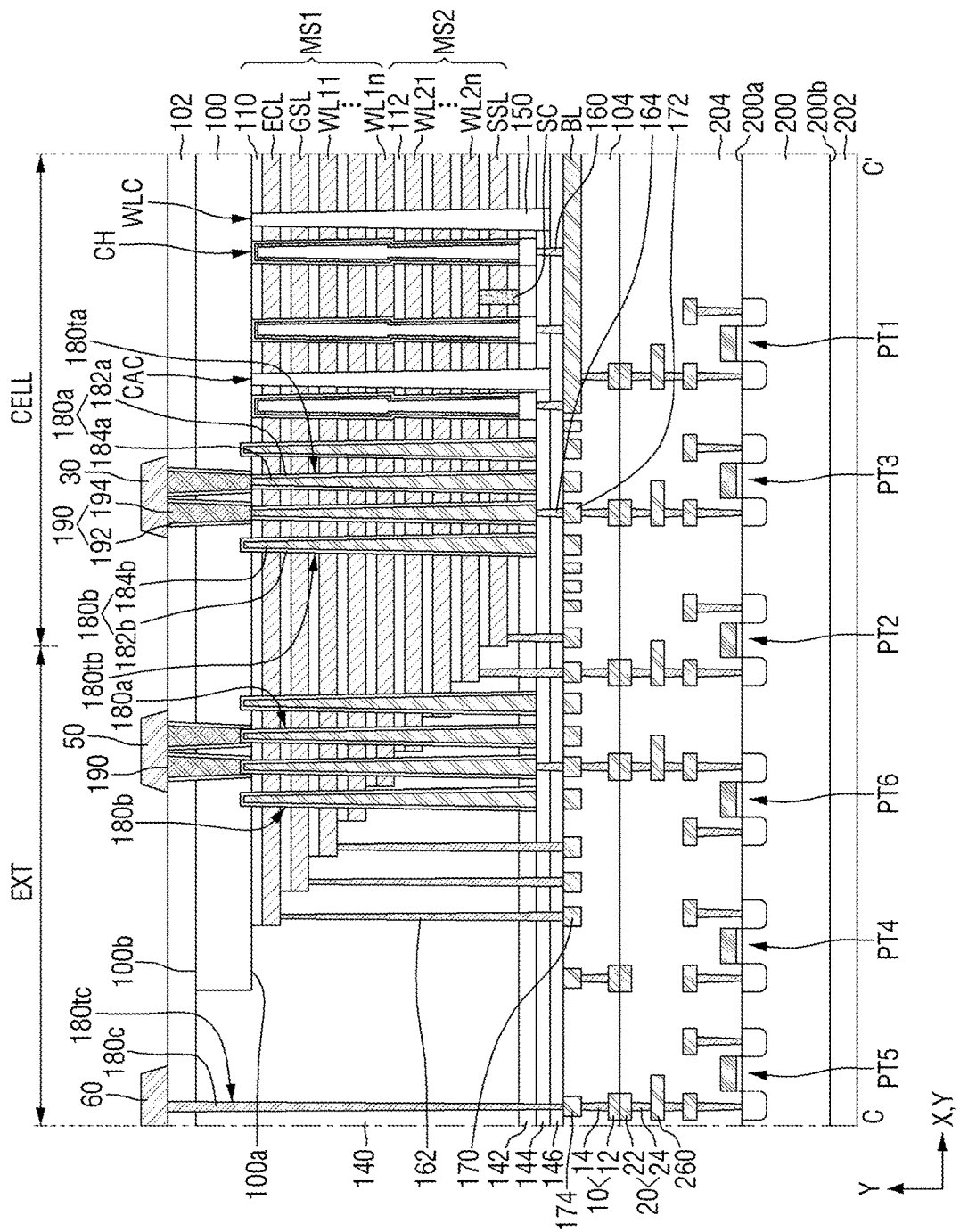
FIG. 11 is a cross-sectional view taken along line C-C' of FIG. 10.

FIG. 10 is a schematic layout diagram of a semiconductor memory device according to some embodiments. FIG. 11 is a cross-sectional view along line C-C' of FIG. 10. For convenience of explanation, repeated parts of contents explained above using FIGS. 1 to 5b will be only briefly explained or omitted.

Referring to FIGS. 10 and 11, a semiconductor memory device according to some embodiments may further include a third through-via 180c and a fourth input-output pad 60.

The third through-via 180c may penetrate the fourth interlayer insulating film 146. For example, a third through-via trench 180tc extending in the third direction Z and penetrating the fourth interlayer insulating film 146 may be formed. The third through-via 180c may be formed inside the third through-via trench 180tc. In some embodiments, the third through-via 180c may penetrate the upper insulating film 102 and the first to fourth interlayer insulating film 140, 142, 144, and 146.

In some embodiments, the first and second mold structures MS1 and MS2 may not be placed in the region in which the third through-via 180c is placed. For example, the third through-via 180c may not overlap the first and second mold structures MS1 and MS2 in the third direction Z, e.g., vertically. The third through-via 180c may be spaced apart from the first and second mold structures MS1 and MS2 in a direction (e.g., the first direction X and/or the second direction Y) parallel to the upper surface (e.g., the first surface 100a) of the first substrate 100.

The fourth input-output pad 60 may be formed on the second surface 100b of the first substrate 100. For example, the fourth input-output pad 60 may be formed on the upper insulating film 102. In some embodiments, the fourth input-output pad 60 may be formed at the same level as the first input-output pad 30 and/or the third input-output pad 50.

The fourth input-output pad 60 may be connected to the third through-via 180c. The fourth input-output pad 60 may be connected to at least one (e.g., the fifth circuit element PT5) of the circuit elements PT1 to PT6 through the third through-via 180c.

Hereinafter, a method of fabricating a semiconductor memory device according to an exemplary embodiment will be described referring to FIGS. 1 to 21. FIGS. 12 to 21 are cross-sectional views of stages in a method for fabricating a semiconductor memory device according to some embodiments. For convenience of explanation, repeated parts of contents explained above using FIGS. 1 to 11 will be only briefly explained or omitted.

Figure 12:
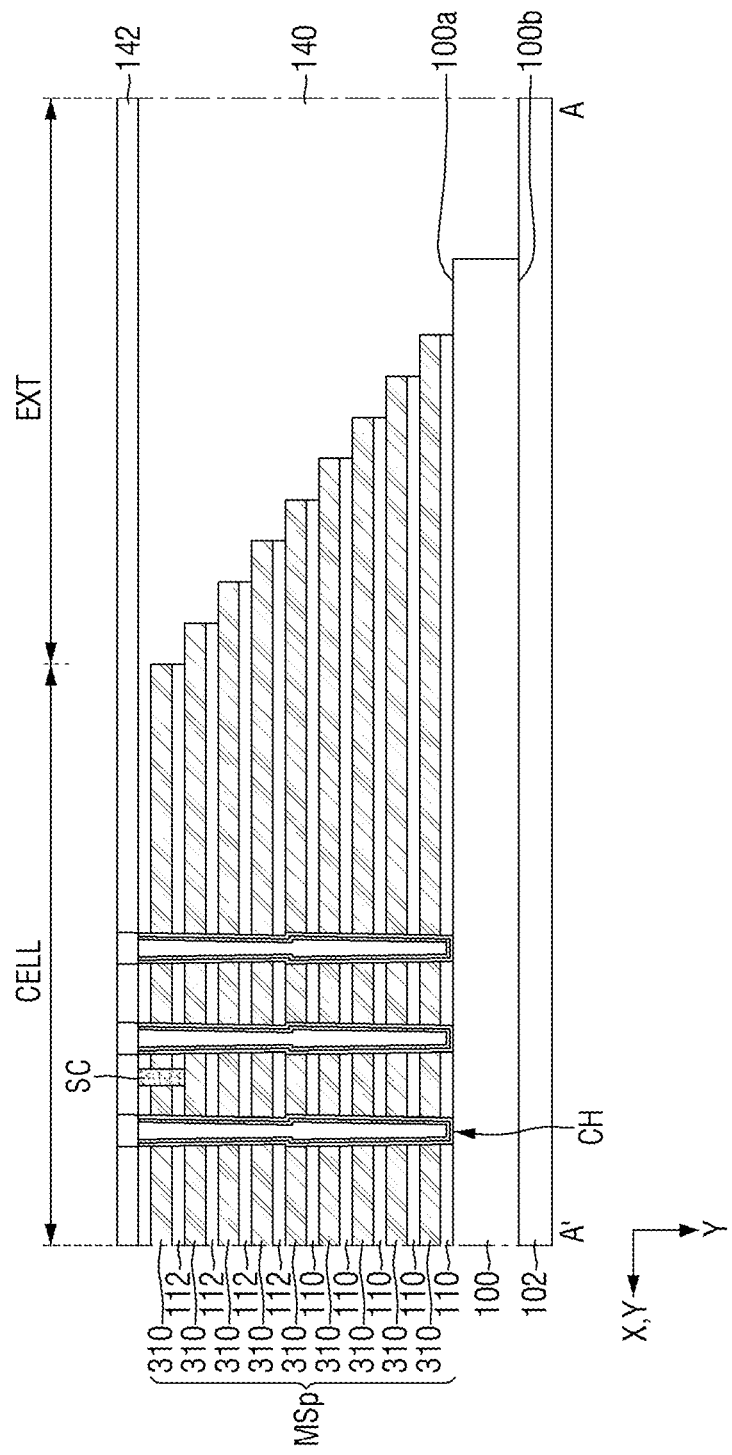
FIGS. 12 to 21 are cross-sectional views of stages in a method for fabricating a semiconductor memory device according to some embodiments.

Referring to FIG. 12, a preliminary mold structure MSp and a plurality of channel structures CH may be formed on the first substrate 100.

First, the first substrate 100 may be provided. The first substrate 100 may include the first surface 100a and the second surface 100b opposite to each other. Also, the first substrate 100 may include the cell array region CELL and the extension region EXT.

Subsequently, a preliminary mold structure MSp may be formed on the first substrate 100. The preliminary mold structure MSp may include mold insulating films 110,112 on the first substrate 100, and a plurality of sacrificial films 310 alternately stacked on the mold insulating films 110,112. The preliminary mold structure MSp of the extension region EXT may be patterned in a stepwise manner.

The mold insulating films 110,112 and the sacrificial films 310 may have different etching selectivity from each other. For example, the mold insulating films 110,112 may include silicon oxide, and the sacrificial film 310 may include silicon nitride, but are not limited thereto.

The plurality of channel structures CH may each penetrate the preliminary mold structure MSp. Also, the channel structures CH may intersect the plurality of sacrificial films 310. In some embodiments, first and second interlayer insulating films 140,142 which cover the preliminary mold structure MSp may be formed. The channel structures CH may penetrate the first and second interlayer insulating films 140,142.

In some embodiments, the string cut region SC may be formed inside the preliminary mold structure MSp of the cell array region CELL. In some embodiments, the string cut region SC may cut the uppermost sacrificial film 310 among the plurality of sacrificial films 310.

Figure 13:
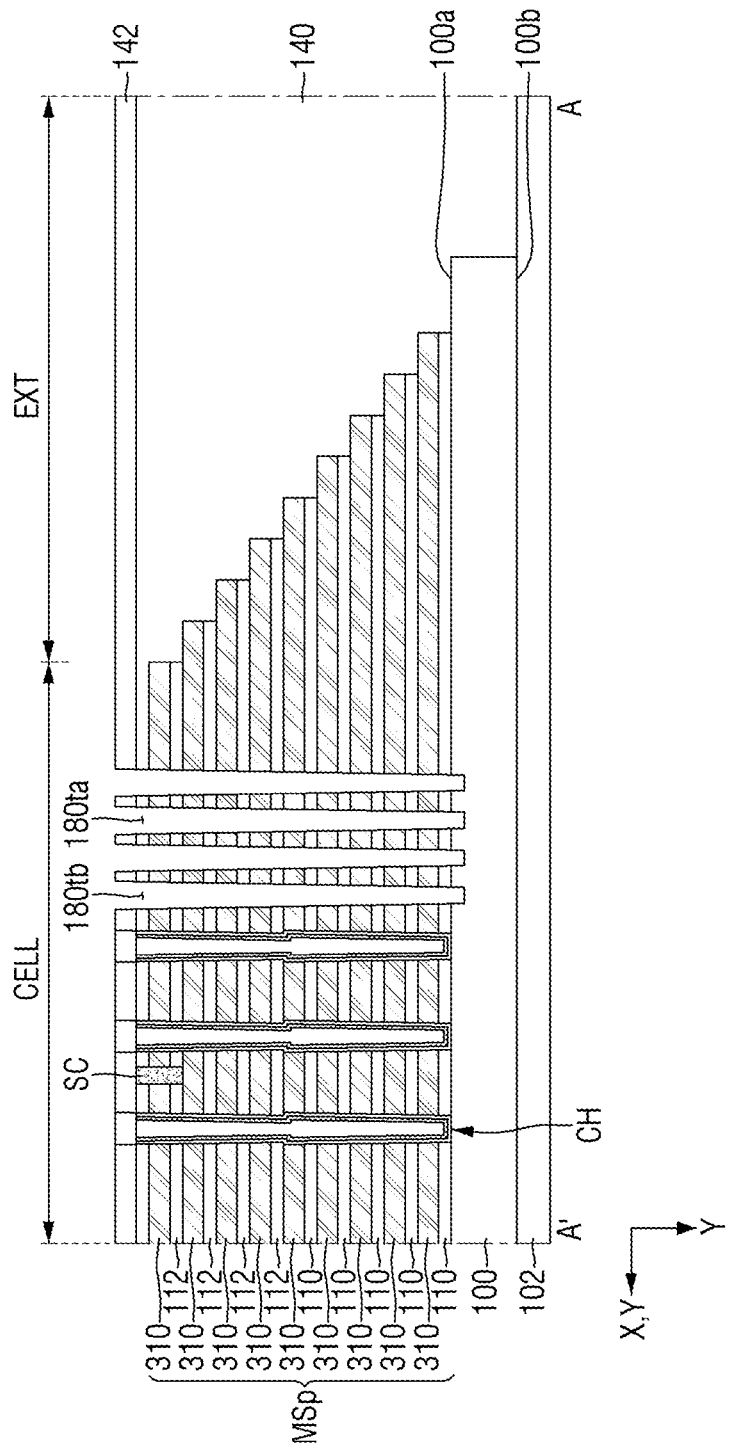

Referring to FIG. 13, a plurality of through-via trenches 180ta,180tb penetrating the preliminary mold structure MSp is formed. The through-via trenches 180ta,180tb may be formed by etching a part of the preliminary mold structure MSp. In some embodiments, the through-via trenches 180ta, 180tb may be formed to expose the first surface 100a of the first substrate 100.

In some embodiments, the through-via trenches 180ta, 180tb may be formed by etching a part of the first substrate 100. Accordingly, the lower surface of the through-via trenches 180ta,180tb may be located to be lower than the first surface 100a of the first substrate 100.

Although the through-via trenches 180ta,180tb are shown as only being formed inside the cell array region CELL, this is only an example. For example, at least part of the through-via trenches 180ta 180tb may be placed in the extension region EXT.

Figure 14:
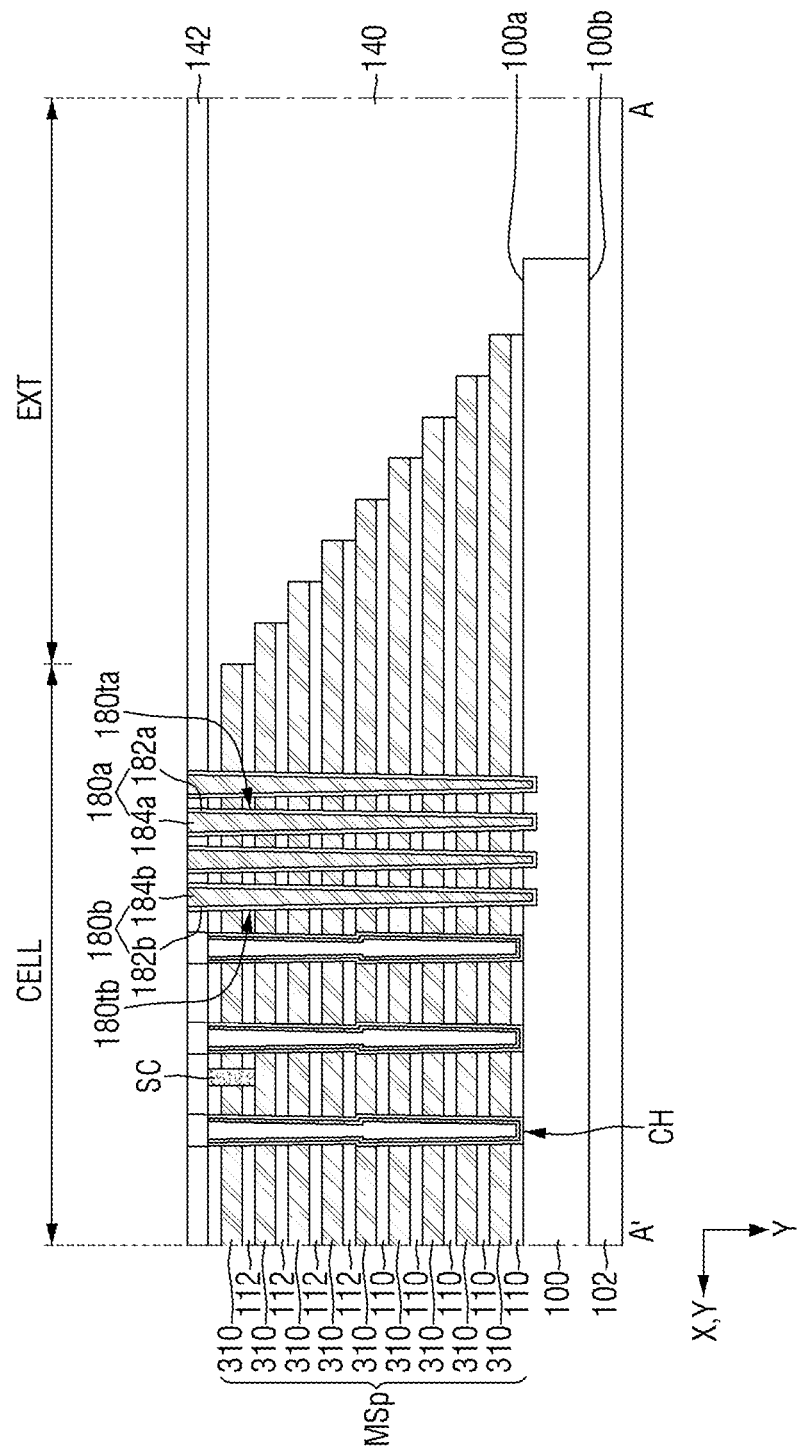

Referring to FIG. 14, the through-vias 180a,180b are formed in the through-via trenches 180ta,180tb. The through-vias 180a,180b may each include through-spacer films 182a,182b and through-conductive patterns 184a, 184b. For example, the through-spacer films 182a,182b may conformally extend along the profile of the side surfaces of the through-via trenches 180ta,180tb. Through-conductive patterns 184a,184b are formed on the through-spacer films 182a,182b, and may fill each of the through-via trenches 180ta 180tb.

Figure 15:
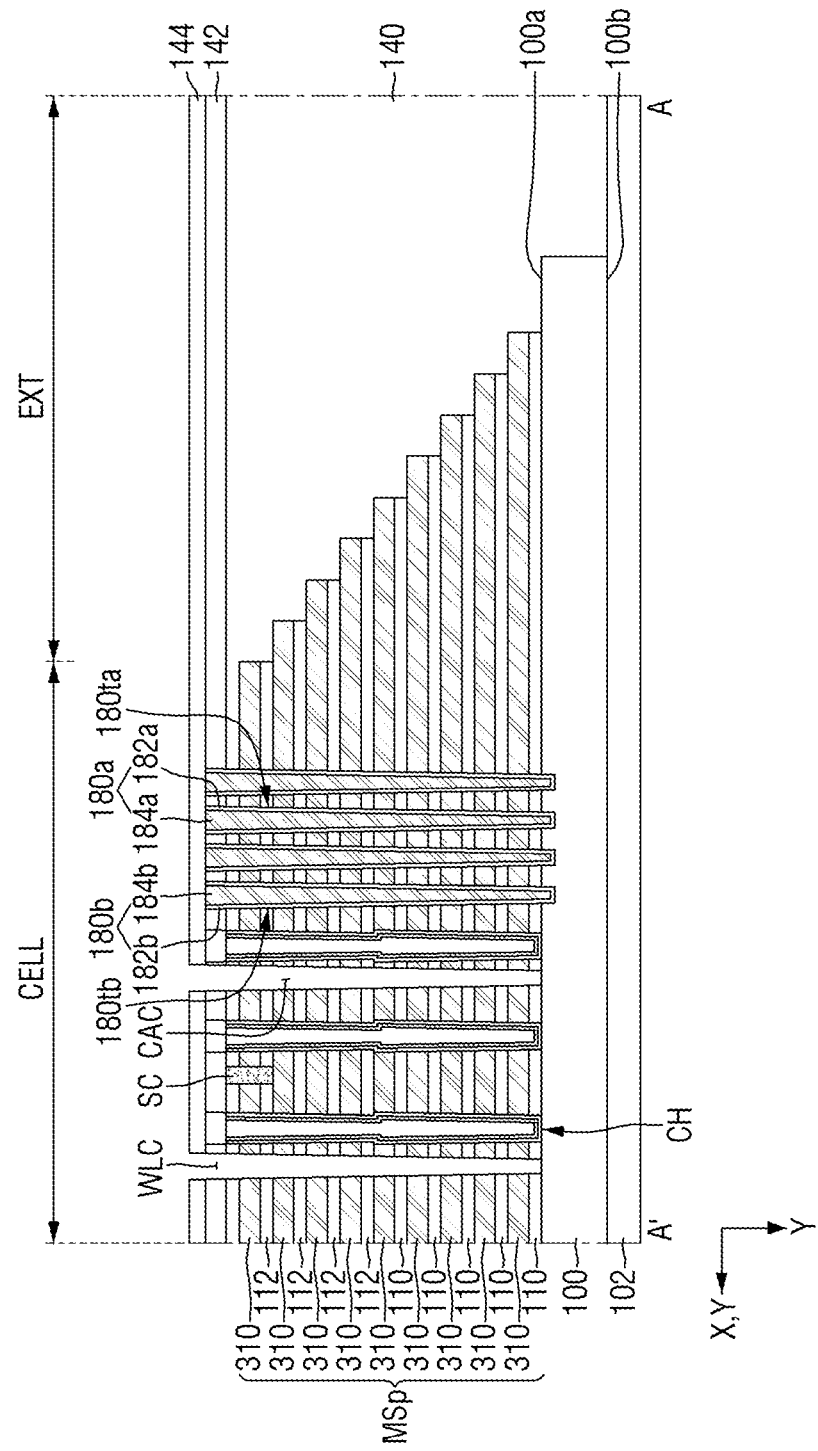

Referring to FIG. 15, the block separation region WLC, the cell gate cut region CAC, and the extension gate cut region CNC are formed in the preliminary mold structure MSp.

The block separation region WLC may be formed in the cell array region CELL and the extension region EXT, and may cut the preliminary mold structure MSp. The cell gate cut region CAC may be formed in the cell array region CELL, and may cut the preliminary mold structure MSp. The extension gate cut region CNC may be formed in the extension region EXT, and may cut the preliminary mold structure MSp.

In some embodiments, the third interlayer insulating film 144 that covers the second interlayer insulating film 142 may be formed. The block separation region WLC, the cell gate cut region CAC, and the extension gate cut region CNC may cut the first to third interlayer insulating film 140, 142, and 144.

Figure 16:
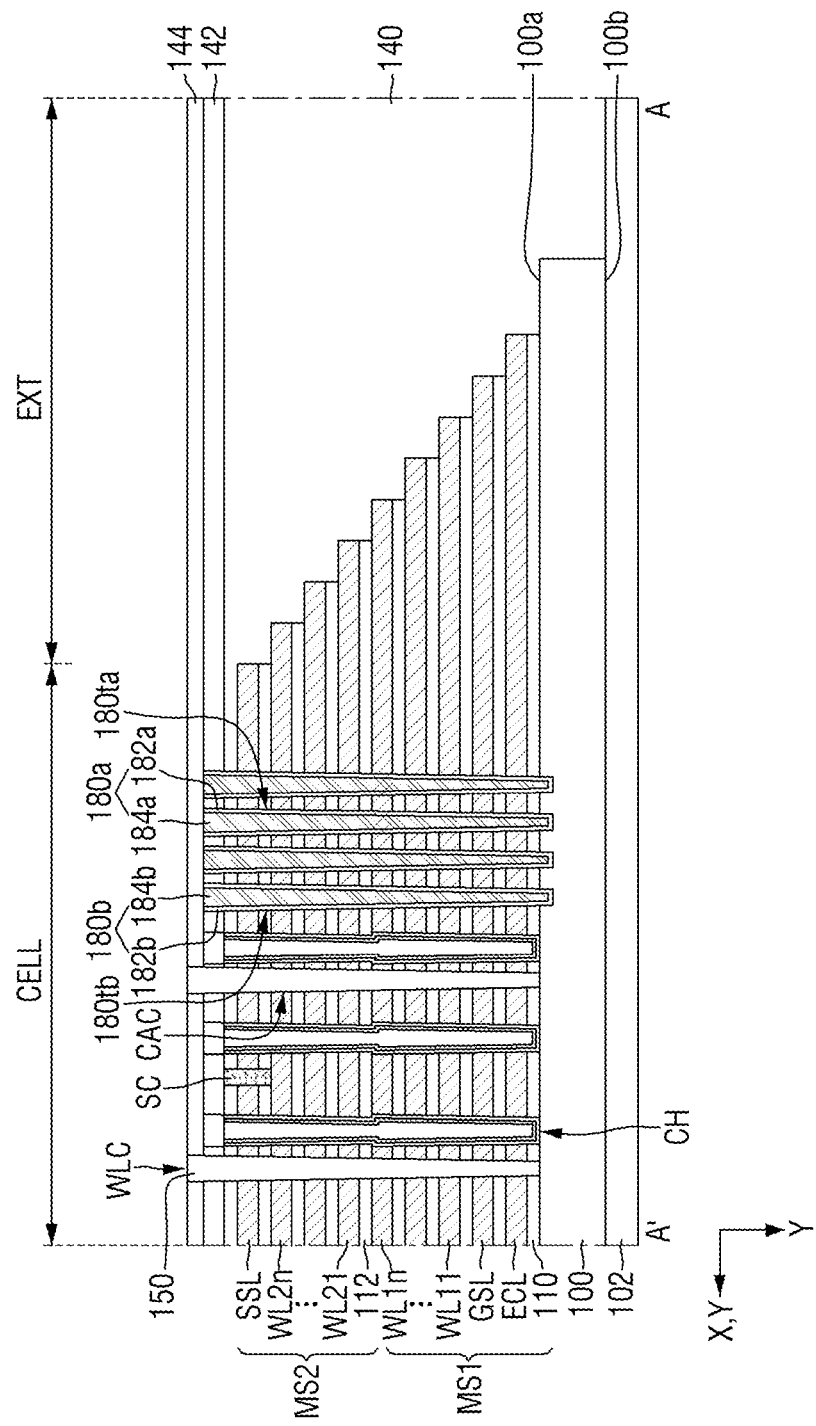

Referring to FIG. 16, the first and second mold structures MS1 and MS2 including the plurality of gate electrodes ECL, GSL, WL11 to WL1n, WL21 to WL2n, and SSL may be formed.

For example, the plurality of sacrificial films 310 may be removed, using the block separation region WLC, the cell gate cut region CAC, and the extension gate cut region CNC. Subsequently, the plurality of gate electrodes ECL, GSL, WL11 to WL1n, WL21 to WL2n, and SSL may be formed in the region from which the plurality of sacrificial films 310 is removed. That is, the plurality of sacrificial films 310 may be replaced with the plurality of gate electrodes ECL, GSL, WL11 to WL1n, WL21 to WL2n, and SSL.

Subsequently, the cut pattern 150 that fills the block separation region WLC, the cell gate cut region CAC, and the extension gate cut region CNC may be formed.

Figure 17:
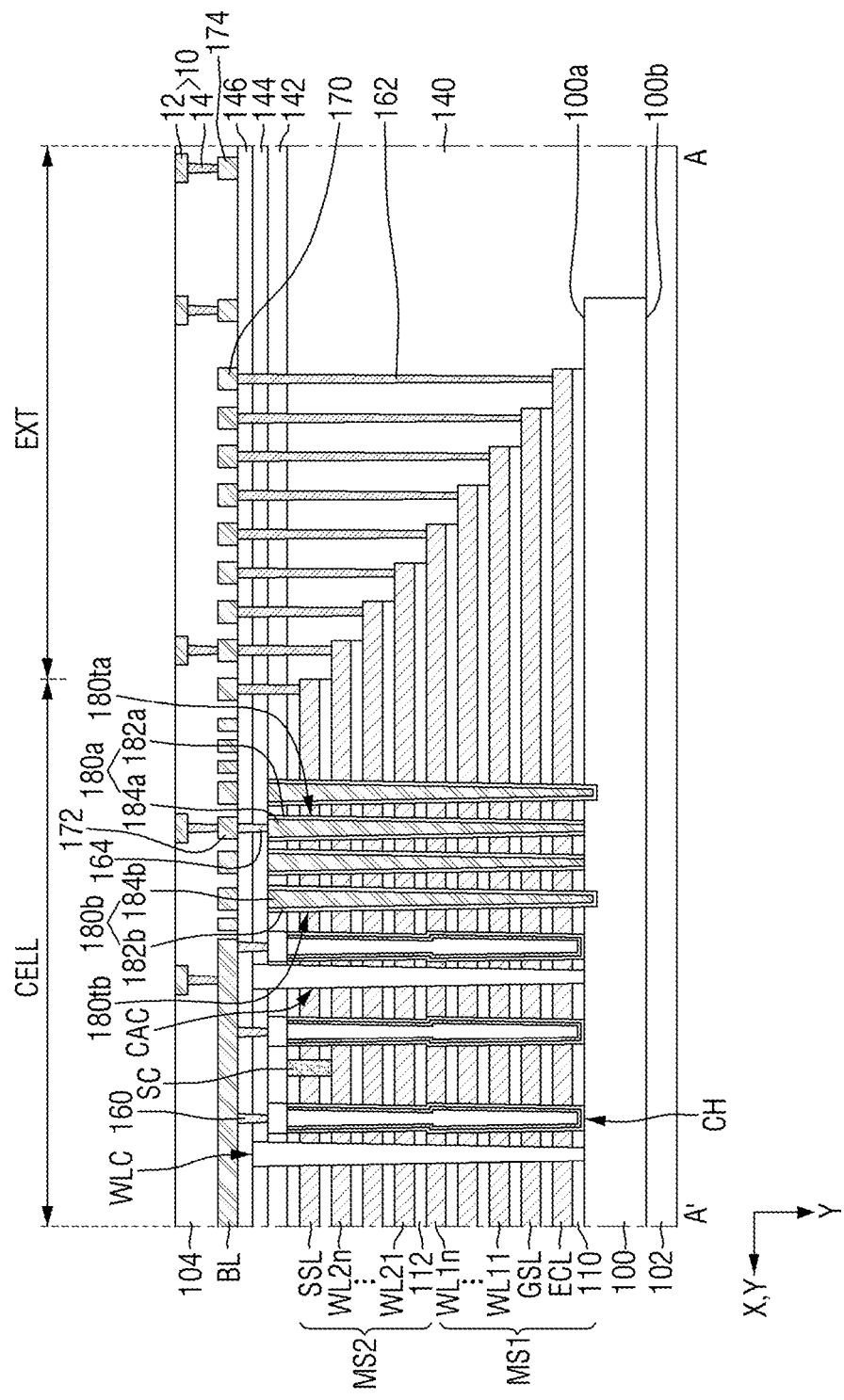

Referring to FIG. 17, the bit line contact 160, the gate contact 162, the connection contact 164, the bit line BL, the third connection wiring 170, the fourth connection wiring 172, and the first wiring structure 10 are formed.

The bit line contact 160, the gate contact 162, and the connection contact 164 may penetrate, e.g., the third and fourth interlayer insulating films 144,146. The bit line contact 160 may be connected to the channel structure CH. The gate contact 162 may be connected to each of the gate electrodes ECL, GSL, WL11 to WL1n, WL21 to WL2n, and SSL. The connection contact 164 may be connected to at least a part (e.g., the first through-via 180a) of the through-vias 180a, 180b.

The bit line BL, the third connection wiring 170, and the fourth connection wiring 172 may be formed on, e.g., the fourth interlayer insulating film 146. The bit line BL may be connected to the bit line contact 160. The third connection wiring 170 may be connected to the gate contact 162. The fourth connection wiring 172 may be connected to the connection contact 164.

Subsequently, the first wiring structure 10 may be formed on the first surface 100a of the first substrate 100. For example, the first inter-wiring insulating film 104 that covers the fourth interlayer insulating film 146, the bit line BL, the third connection wiring 170, and the fourth connection wiring 172 may be formed. The first wiring structure 10 may include the first connection wiring 12 and the first connection via 14 that are formed in the first inter-wiring insulating film 104 and electrically connected to the bit line BL, the third connection wiring 170, and the fourth connection wiring 172.

Figure 18:
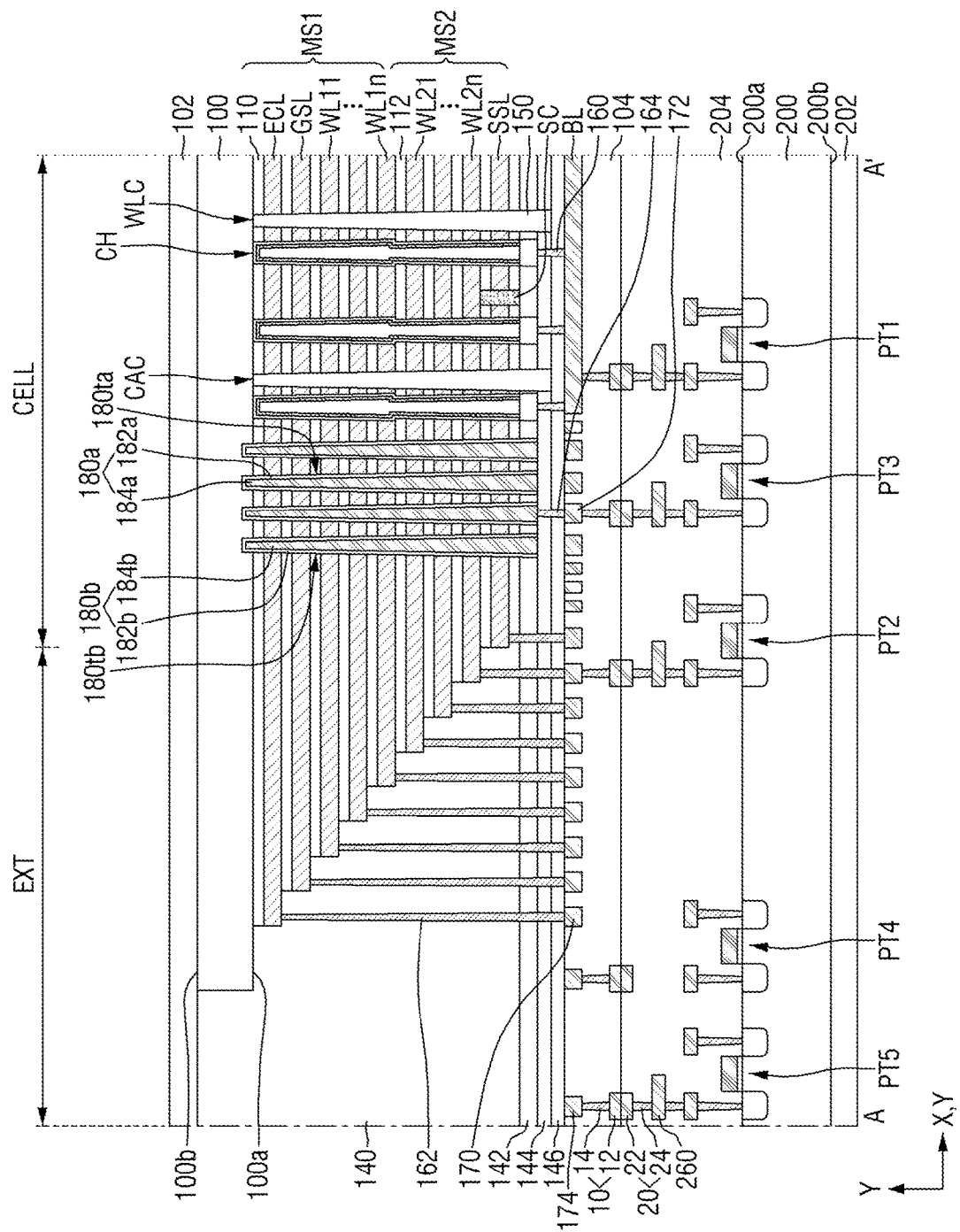

Referring to FIG. 18, the first inter-wiring insulating film 104 is attached on the second inter-wiring insulating film 204.

First, the second substrate 200 may be provided. The second substrate 200 may include the third surface 200a facing the first surface 100a, and the fourth surface 200b opposite to the third surface 200a. In some embodiments, the circuit elements PT1 to PT5 may be formed on the third surface 200a of the second substrate 200.

Subsequently, the second wiring structure 20 may be formed on the third surface 200a of the second substrate 200. For example, the second inter-wiring insulating film 204 that covers the circuit elements PT1 to PT5 may be formed. The second wiring structure 20 may include the second connection wiring 22 and the second connection via 24 that are formed in the second inter-wiring insulating film 204 and is electrically connected to the circuit elements PT1 to PT5.

Subsequently, the first inter-wiring insulating film 104 and the second inter-wiring insulating film 204 may be attached. The first wiring structure 10 and the second wiring structure 20 may be electrically connected. For example, the first connection wiring 12 exposed from the first inter-wiring insulating film 104 may be in contact with the second connection wiring 22 exposed from the second inter-wiring insulating film 204. The first connection wiring 12 and the second connection wiring 22 may be electrically connected, e.g., by a copper-copper bonding (Cu to Cu bonding process).

Figure 19:
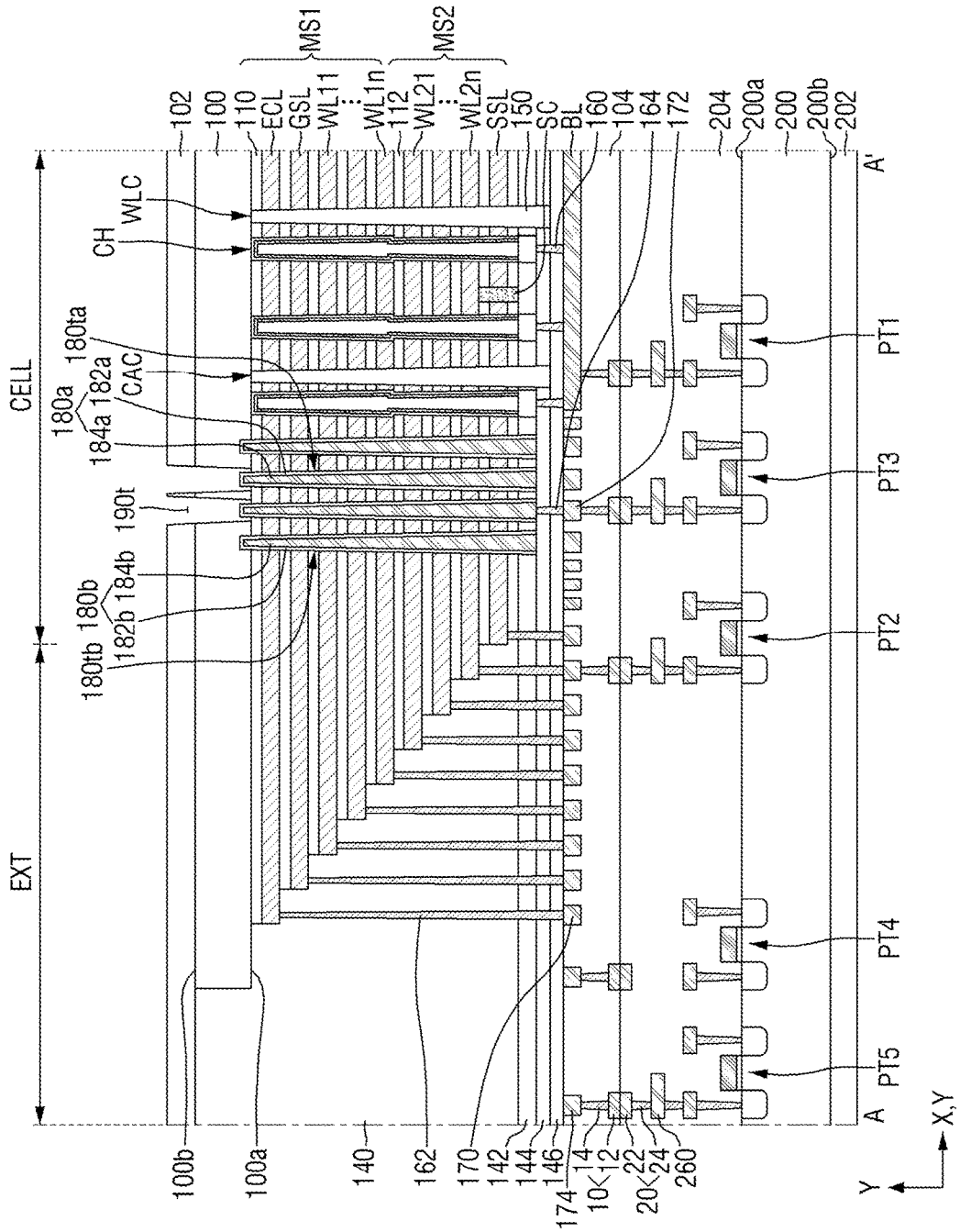

Referring to FIG. 19, the first contact via trench 190t penetrating the first substrate 100 may be formed.

The first contact via trench 190t may be formed by etching a part of the first substrate 100. In some embodiments, the first contact via trench 190t may be formed to expose at least a part of the through-vias 180a,180b. For example, the first contact via trench 190t may expose the first through-via 180a, e.g., without exposing the second through-via 180b. In some embodiments, the first contact via trench 190t may penetrate the upper insulating film 102 and the first substrate 100 and expose the first through-via 180a.

Figure 20:
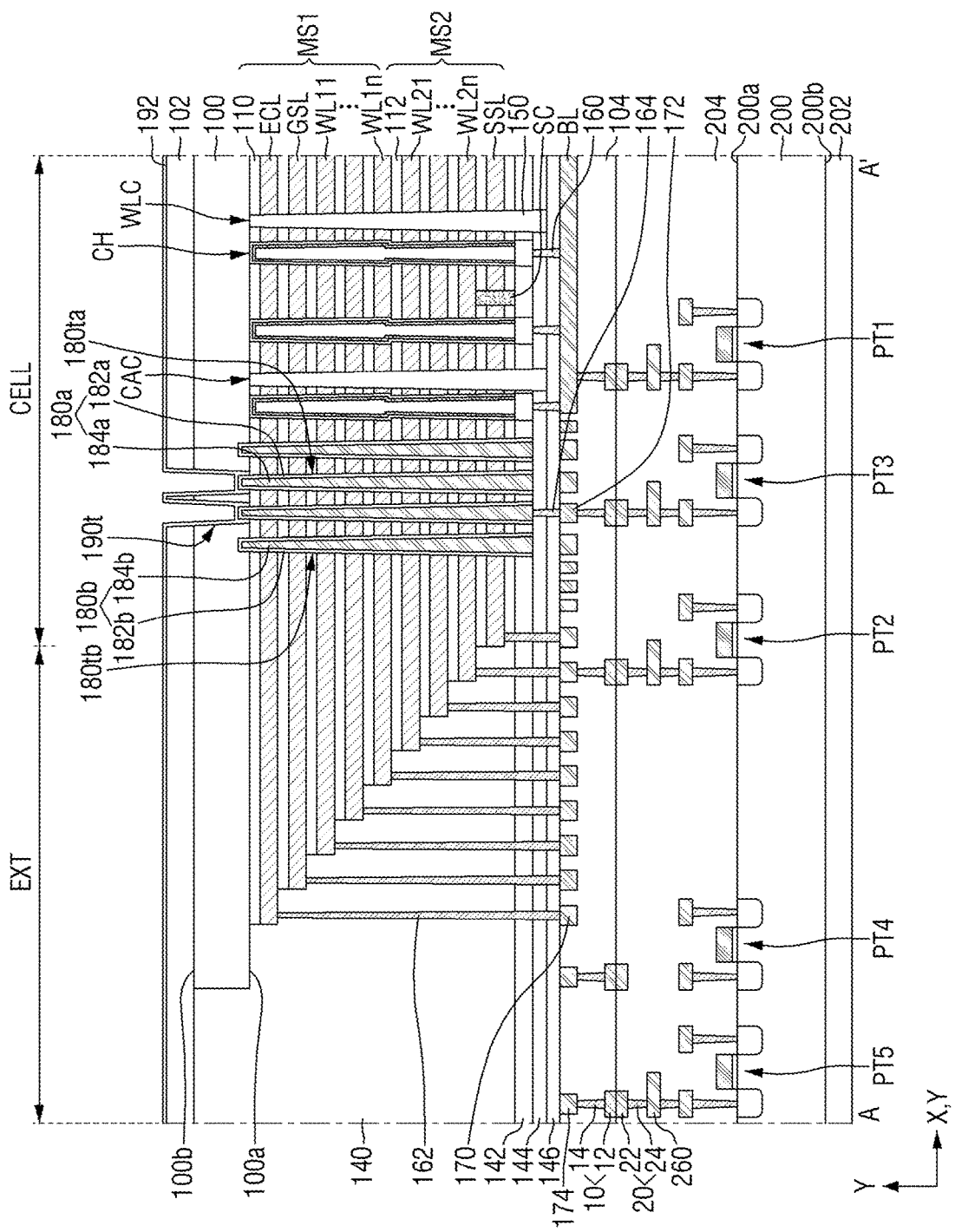

Referring to FIG. 20, the third spacer film 192 is formed inside the first contact via trench 190t. For example, the third spacer film 192 may conformally extend along the profiles of the side surface and the lower surface of the first contact via trench 190t, and the upper surface of the upper insulating film 102.

Figure 21:
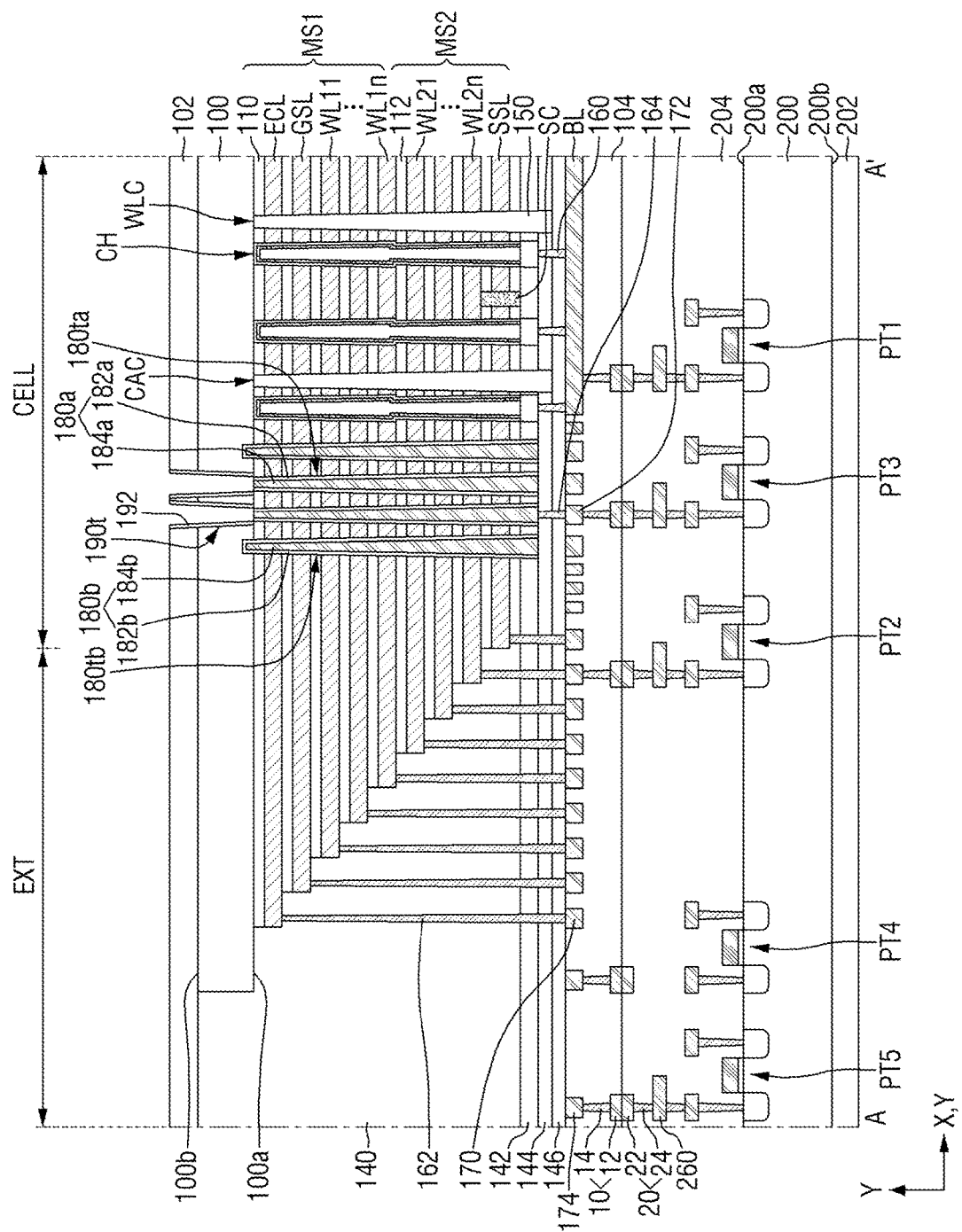

Referring to FIG. 21, a part of the third spacer film 192 and a part of the first spacer film 182a are removed to expose the first conductive pattern 184a. For example, the third spacer film 192 extending along the lower surface of the first contact via trench 190t, and the first spacer film 182a extending along the lower surface of the first through-via trench 180ta may be removed, so the first conductive pattern 184a may be exposed through the first contact via trench 190t.

In some embodiments, the first conductive pattern 184a may be exposed by an anisotropic etching process. For example, a part of the third spacer film 192 and a part of the first spacer film 182a may be removed by a dry etching process. In some embodiments, a part of the third spacer film 192 and a part of the first spacer film 182a may be removed in-situ.

Subsequently, referring to FIG. 3, the third conductive pattern 194 is formed inside the first contact via trench 190t. The third conductive pattern 194 may be, e.g., directly, connected to the first conductive pattern 184a exposed by the first contact via trench 190t. Accordingly, the first contact via 190 that is electrically connected to the first through-via 180a may be formed.

Subsequently, the first input-output pad 30 connected to the first contact via 190 may be formed on the second surface 100b of the first substrate 100. For example, the first input-output pad 30 may be formed on the upper insulating film 102 and connected to the first contact via 190.

In the method of fabricating the semiconductor memory device according to some embodiments, the first through-via 180a may be exposed in the process of forming the first contact via 190. Specifically, as mentioned above, a part of the third spacer film 192 and a part of the first spacer film 182a may be removed in-situ. That is, in the method for fabricating the semiconductor memory device according to some embodiments, since a separate process for removing the first spacer film 182a is not required, the first contact via 190 connected to the first through-via 180a may be formed in a simpler process. Accordingly, it is possible to provide a semiconductor memory device in which the cost is reduced and the productivity is improved.

Hereinafter, an electronic system including a semiconductor memory device according to an exemplary embodiment will be described referring to FIGS. 1 to 24.

Figure 23:
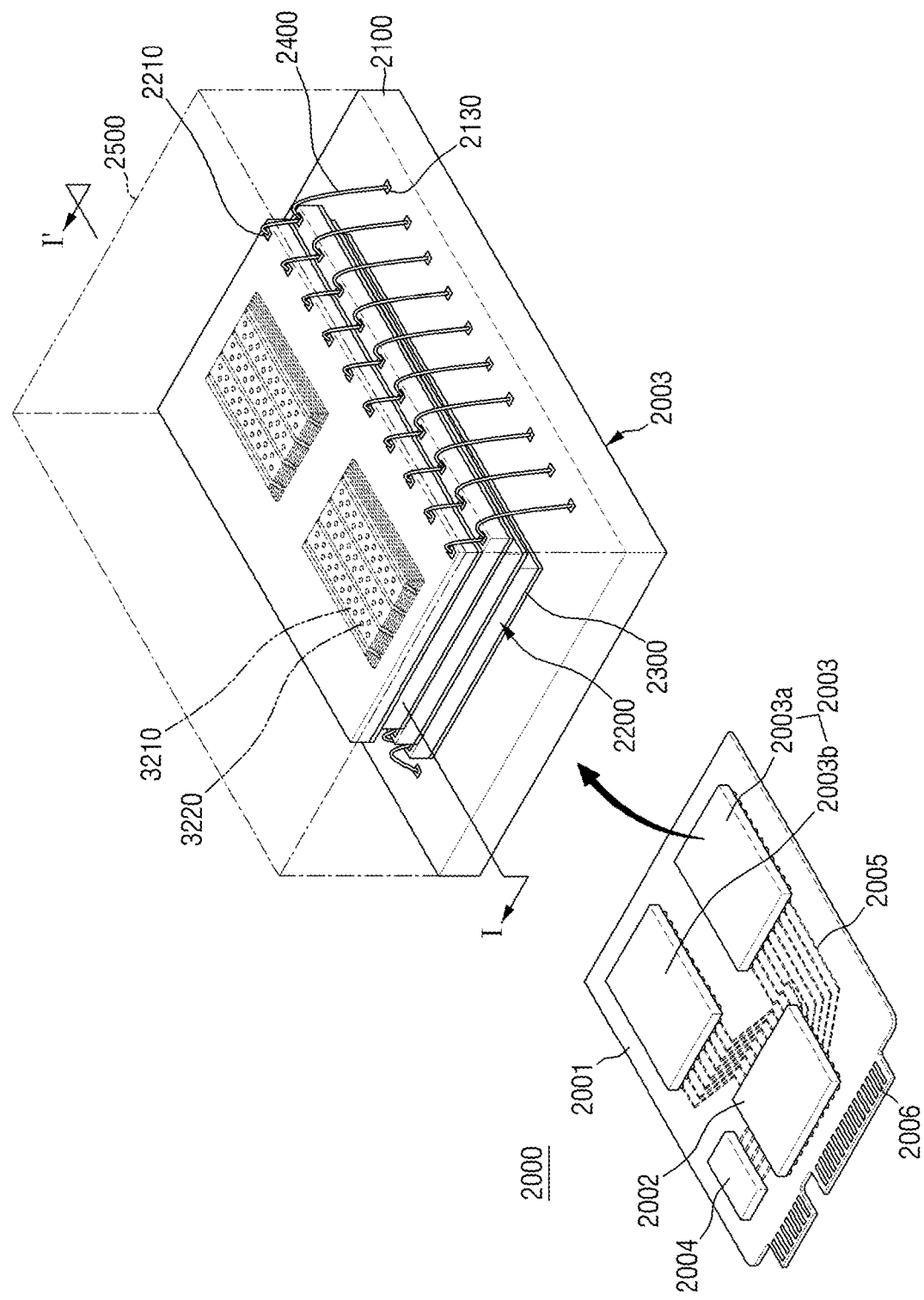
FIG. 23 is a schematic perspective view of an electronic system according to some embodiments.
Figure 24:
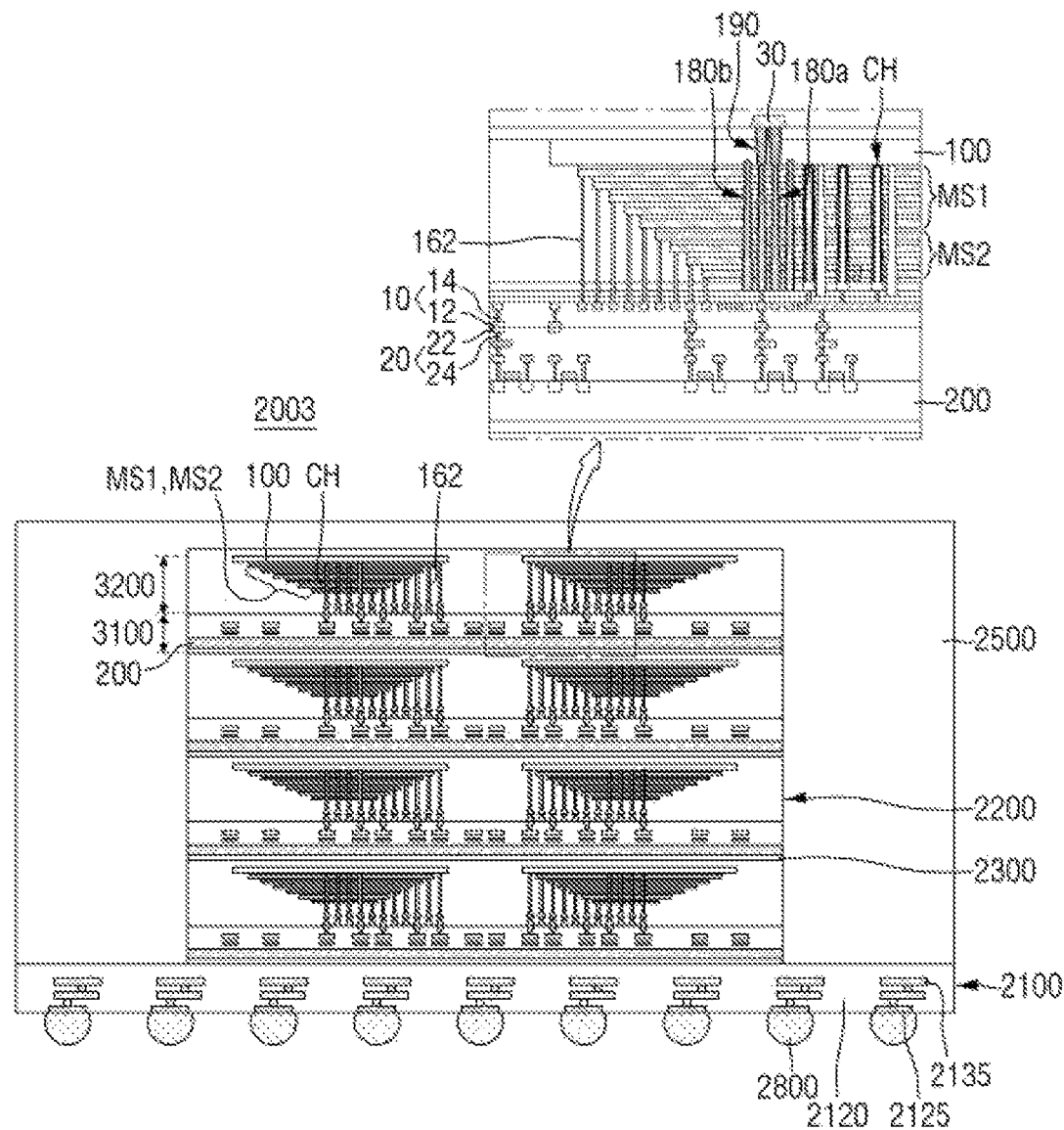
FIG. 24 is a schematic cross-sectional view taken along line I-I' of FIG. 23.

FIG. 22 is a schematic block diagram for explaining an electronic system according to some embodiments. FIG. 23 is a schematic perspective view for explaining the electronic system according to some embodiments. FIG. 24 is a schematic cross-sectional view taken along line I-I' of FIG. 23.

Referring to FIG. 22, an electronic system 1000 according to some embodiments may include a semiconductor memory device 1100 and a controller 1200 electrically connected to the semiconductor memory device 1100. The electronic system 1000 may be a storage device that includes a single or plurality of semiconductor memory devices 1100, or an electronic device that includes the storage device. For example, the electronic system 1000 may be a solid state drive (SSD) device including a single or plurality of semiconductor memory devices 1100, a Universal Serial Bus (USB), a computing system, a medical device or a communication device.

The semiconductor memory device 1100 may be a nonvolatile memory device (e.g., a NAND flash memory device), and may be, e.g., the semiconductor memory device described above using FIGS. 1 to 11.

The semiconductor memory device 1100 may communicate with the controller 1200 through an input-output pad 1101 that is electrically connected to the logic circuit 1130. The input-output pad 1101 may be electrically connected to the logic circuit 1130 through an input-output connection wiring 1135 extending from inside of a first structure 1100F to a second structure 1100S. The input-output pad 1101 may be at least one of the first to fourth input-output pad 30, 40, 50, and 60 described above, e.g., using FIGS. 1 to 11. The input-output connection wiring 1135 may be, e.g., at least one of the through-vias 180a,180 explained above using FIGS. 1 to 11.

The controller 1200 may include a processor 1210, a NAND controller 1220, and a host interface 1230. In some embodiments, the electronic system 1000 may include a plurality of semiconductor memory devices 1100, and in this case, the controller 1200 may control the plurality of semiconductor memory devices 1100.

The processor 1210 may control the operation of the overall electronic system 1000 including the controller 1200. The processor 1210 may operate according to a predetermined firmware, and may control the NAND controller 1220 to access the semiconductor memory device 1100. The NAND controller 1220 may include a NAND interface 1221 that processes the communication with the semiconductor memory device 1100. Control commands for controlling the semiconductor memory device 1100, data to be recorded in the memory cell transistors MCT of the semiconductor memory device 1100, data to be read from the memory cell transistors MCT of the semiconductor memory device 1100, and the like may be transmitted through the NAND interface 1221. The host interface 1230 may provide a communication function between the electronic system 1000 and an external host. When receiving the control commands from an external host through the host interface 1230, the processor 1210 may control the semiconductor memory device 1100 in response to the control command.

Referring to FIG. 23, the electronic system according to some embodiments may include a main board 2001, a main controller 2002 mounted on the main board 2001, one or more semiconductor packages 2003, and a dynamic random-access memory (DRAM) 2004. The semiconductor package 2003 and the DRAM 2004 may be connected to the main controller 2002 by wiring patterns 2005 formed on the main board 2001.

The main board 2001 may include a connector 2006 including a plurality of pins joined to an external host. In the connector 2006, the number and arrangement of the plurality of pins may vary depending on the communication interface between the electronic system 2000 and the external host. In some embodiments, the electronic system 2000 may communicate with an external host according to any one of the interfaces such as M-Phy for a USB, a PCI-Express (Peripheral Component Interconnect Express), a SATA (Serial Advanced Technology Attachment), and a UFS (Universal Flash Storage). In some embodiments, the electronic system 2000 may operate by power supplied from an external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for alleviating a speed difference between the semiconductor package 2003, which is a data storage space, and the external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004, in addition to a NAND controller for controlling the semiconductor package 2003.

The semiconductor package 2003 may include first and second semiconductor packages 2003a and 2003b spaced apart from each other. The first and second semiconductor packages 2003a and 2003b may be semiconductor packages including a plurality of semiconductor chips 2200, respectively. Each of the first and second semiconductor packages 2003a and 2003b may include a package substrate 2100, semiconductor chips 2200 on the package substrate 2100, bonding layers 2300 placed on the lower surfaces of each of the semiconductor chips 2200, a connection structure 2400 that electrically connects the semiconductor chips 2200 and the package substrate 2100, and a molding layer 2500 that covers the semiconductor chips 2200 and the connection structure 2400 on the package substrate 2100.

The package substrate 2100 may be a printed circuit board including package upper pads 2130. Each semiconductor chip 2200 may include an input-output pad 2210. The input-output pad 2210 may correspond to the input-output pad 1101 of FIG. 22. Each of the semiconductor chips 2200 may include memory blocks 3210 and channel structures 3220. The memory blocks 3210 may correspond to the memory block described above, e.g., using FIGS. 1 to 11, and the channel structures 3220 may correspond to the channel structure CH described above, e.g., using FIGS. 1 to 11. Each of the semiconductor chips 2200 may include the semiconductor memory device described above, e.g., using FIGS. 1 to 11.

In some embodiments, the connection structure 2400 may be a bonding wire that electrically connects the input-output pad 2210 to the package upper pads 2130. Therefore, in each of the first and second semiconductor packages 2003a, 2003b, the semiconductor chips 2200 may be electrically connected to each other by the bonding wire type, and may be electrically connected to the package upper pads 2130 of the package substrate 2100. In some embodiments, in each of the first and second semiconductor packages 2003a, 2003b, the semiconductor chips 2200 may also be electrically connected to each other by a connection structure including a through silicon via (TSV), in place of the bonding wire-type connection structure 2400.

In some embodiments, the main controller 2002 and the semiconductor chips 2200 may be included in a single package. In some embodiments, the main controller 2002 and the semiconductor chips 2200 are mounted on a separate interposer substrate different from the main board 2001, and the main controller 2002 and the semiconductor chips 2200 may also be connected to each other by the wiring formed on the interposer substrate.

Referring to FIG. 24, in the semiconductor package 2003, the package substrate 2100 may be a printed circuit board. The package substrate 2100 may include a package substrate body portion 2120, package upper pads (2130 of FIG. 23) placed on the upper surface of the package substrate body portion 2120, lower pads 2125 placed on the lower surface of the package substrate body portion 2120 or exposed through the lower surface, and internal wirings 2135 that electrically connect the upper pads 2130 and the lower pads 2125 inside the package substrate body portion 2120. The upper pads 2130 may be electrically connected to the connection structures 2400. The lower pads 2125 may be connected to wiring patterns 2005 of the main board 2010 of the electronic system 2000 through conductive connections 2800, as shown in FIG. 23.

Each of the semiconductor chips 2200 may include a semiconductor substrate 3010, and a first structure 3100 and a second structure 3200 that are sequentially stacked on the semiconductor substrate 3010. The first structure 3100 may include the second substrate 200 described above, e.g., using FIGS. 1 to 11. The second structure 3200 may include the first substrate 100 described above, e.g., using FIGS. 1 to 11. The second structure 3200 may also include the first and second mold structures MS1 and MS2, the channel structure CH, and the gate contact 162. Further, as shown, the second structure 3200 may include the through-vias 180a,180b, the first contact via 190, and the first input-output pad 30 described above, using FIGS. 1 to 11.

In some embodiments, each of the semiconductor chips 2200 may include a first structure 3100 and a second structure 3200 bonded by a wafer bonding type. For example, as shown, the first connection wiring 12 and the second connection wiring 22 may be electrically connected by a copper-copper bonding (Cu to Cu bonding) process.

The semiconductor chips 2200 may be electrically connected to each other by the connection structures (2400 of FIG. 23) in the form of bonding wire. However, this is only an example, and the semiconductor chips 2200 in the single semiconductor package may also be electrically connected to each other by a connection structure including the through silicon via (TSV).

By way of summation and review, aspects of embodiments provide a semiconductor memory device with improved integration and productivity. Aspects of embodiments also provide an electronic system including a semiconductor memory device with improved integration and productivity, as well as a method for fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a first substrate including a first surface and a second surface opposite to each other;
   a mold structure including a plurality of gate electrodes stacked sequentially on the first surface of the first substrate;
   a channel structure which penetrates the mold structure and intersects the plurality of gate electrodes;
   a first contact via penetrating the first substrate;
   a second substrate including a third surface facing the first surface, and a fourth surface opposite to the third surface;
   a circuit element on the third surface of the second substrate;
   a first through-via through the mold structure, the first through-via connecting the first contact via and the circuit element, and the first through-via including:
     a first conductive pattern, and
     a first spacer film separating the first conductive pattern from the mold structure; and
   a second through-via through the mold structure, the second through-via being spaced apart from the first through-via, and the second through-via including:
     a second conductive pattern, and
     a second spacer film separating the second conductive pattern from the first substrate and the mold structure.

2. The semiconductor memory device as claimed in claim 1, wherein each of a width of the first through-via and a width of the second through-via decreases toward the first substrate.

3. The semiconductor memory device as claimed in claim 1, wherein a width of the first contact via decreases toward the mold structure.

4. The semiconductor memory device as claimed in claim 1, wherein the mold structure includes a through-via trench which exposes the first substrate, the second spacer film extending along a side surface and a lower surface of the through-via trench.

5. The semiconductor memory device as claimed in claim 1, wherein the second conductive pattern does not connect the first contact via and the circuit element.

6. The semiconductor memory device as claimed in claim 1, wherein the first contact via includes:
   a third conductive pattern; and
   a third spacer film which separates the third conductive pattern from the first substrate.

7. The semiconductor memory device as claimed in claim 1, wherein the first substrate includes a substrate trench extending from the first surface, the first through-via and the second through-via being in the substrate trench.

8. The semiconductor memory device as claimed in claim 1, further comprising a first input-output pad connected to the first contact via, the first input-output pad being on the second surface of the first substrate.

9. The semiconductor memory device as claimed in claim 8, further comprising:
   a second contact via penetrating the second substrate; and
   a second input-output pad connected to the second contact via, the second input-output pad being on the fourth surface of the second substrate.

10. The semiconductor memory device as claimed in claim 1, wherein each of the first through-via and the second through-via penetrates a first portion of the plurality of gate electrodes, and does not penetrate a second portion of the plurality of gate electrodes.

11. The semiconductor memory device as claimed in claim 1, further comprising:
    an interlayer insulating film covering the mold structure on the first substrate;
    a third through-via spaced part from the mold structure, the third through-via penetrating the interlayer insulating film; and
    a second input-output pad connected to the third through-via.

12. A semiconductor memory device, comprising:
    a first substrate including a first surface and a second surface opposite to each other;
    a mold structure including a plurality of gate electrodes stacked sequentially on the first surface of the first substrate;
    a channel structure which penetrates the mold structure and intersects the plurality of gate electrodes;
    a first through-via including:
      a first conductive pattern through the mold structure, and
      a first spacer film separating the first conductive pattern from the mold structure;
    a second through-via including:
      a second conductive pattern through the mold structure, and
      a second spacer film separating the second conductive pattern from the first substrate and the mold structure;
    an upper insulating film on the second surface of the first substrate;
    a contact trench through the upper insulating film and the first substrate, the contact trench exposing the first conductive pattern;
    a contact via including:
      a third spacer film along side surfaces of the contact trench, and
      a third conductive pattern connected to the first conductive pattern on the third spacer film;
    an input-output pad connected to the contact via, the input-output pad being on the upper insulating film;
    a second substrate includes a third surface facing the first surface, and a fourth surface opposite to the third surface; and
    a first circuit element connected to the first through-via, the first circuit element being on the third surface of the second substrate.

13. The semiconductor memory device as claimed in claim 12, wherein the channel structure includes:

a semiconductor pattern intersecting the plurality of gate electrodes; and an information storage film between the semiconductor pattern and the mold structure.

14. The semiconductor memory device as claimed in claim 12, further comprising:
   a block separation region extending in a first direction to cut the mold structure; and
   a bit line extending in a second direction intersecting the first direction, the bit line being connected to the channel structure between the mold structure and the second substrate.

15. The semiconductor memory device as claimed in claim 14, further comprising:
   a second circuit element connected to the bit line, the second circuit element being on the third surface of the second substrate; and
   a third circuit element connected to each of the gate electrodes, the third circuit element being on the third surface of the second substrate.

16. An electronic system, comprising:
   a main board;
   a semiconductor memory device on the main board; and
   a controller electrically connected to the semiconductor memory device, the controller being on the main board,
   wherein the semiconductor memory device includes:
      a first substrate having a first surface opposite a second surface,
      a mold structure including a plurality of gate electrodes stacked sequentially on the first surface of the first substrate,
      a channel structure which penetrates the mold structure and intersects the plurality of gate electrodes,
      a contact via penetrating the first substrate, the contact via being electrically connected to the controller,
      a second substrate including a third surface facing the first surface, and a fourth surface opposite to the third surface,
      a circuit element on the third surface of the second substrate,
      a first through-via through the mold structure, the first through-via connecting the contact via and the circuit element, and the first through-via including:
         a first conductive pattern, and
         a first spacer film separating the first conductive pattern from the mold structure; and
      a second through-via through the mold structure, the second through-via being spaced apart from the first through-via, and the second through-via including:
         a second conductive pattern, and
         a second spacer film separating the second conductive pattern from the first substrate and the mold structure.

17. The electronic system as claimed in claim 16, wherein the semiconductor memory device further includes an input-output pad connected to the contact via, the input-output pad being electrically connected to the controller on the second surface of the first substrate.

18. The electronic system as claimed in claim 17, further comprising wiring patterns which electrically connect the input-output pad and the controller on the main board.

19. The electronic system as claimed in claim 16, wherein the contact via includes:
   a third conductive pattern; and
   a third spacer film which separates the third conductive pattern from the first substrate.

20. The electronic system as claimed in claim 19, wherein:
   each of a width of the first through-via and a width of the second through-via decreases toward the first substrate, and
   a width of the contact via decreases toward the mold structure.

* * * * *